United States Patent
Anderson et al.

(10) Patent No.: US 9,454,193 B2
(45) Date of Patent: Sep. 27, 2016

(54) FLASH DRIVE SHAPED TO UTILIZE SPACE BEHIND A MOBILE DEVICE

(71) Applicant: LEEF TECHNOLOGY LIMITED, Alamo, CA (US)

(72) Inventors: Jon Lee Anderson, Salt Lake City, UT (US); Axle Dean Looslie, Salt Lake City, UT (US); Mark Edwin Schulte, Orem, UT (US); Troy Austin Leininger, Provo, UT (US); Sergey Samorukov, Moscow (RU); David Field Smurthwaite, Alamo, CA (US)

(73) Assignee: LEEF INNOVATION LTD, Alamo, CA (US)

( * ) Notice: Subject to any disclaimer, the term of this patent is extended or adjusted under 35 U.S.C. 154(b) by 0 days.

(21) Appl. No.: 14/960,193

(22) Filed: Dec. 4, 2015

(65) Prior Publication Data
US 2016/0091936 A1     Mar. 31, 2016

Related U.S. Application Data

(63) Continuation of application No. 14/602,226, filed on Jan. 21, 2015.

(60) Provisional application No. 62/039,367, filed on Aug. 19, 2014.

(51) Int. Cl.
*G06F 1/16*     (2006.01)
*H05K 5/00*     (2006.01)
(Continued)

(52) U.S. Cl.
CPC ............. *G06F 1/187* (2013.01); *G06F 3/0619* (2013.01); *G06F 3/0652* (2013.01);
(Continued)

(58) Field of Classification Search
CPC ...... G06F 1/1656; G06F 1/1684; G06F 1/266
USPC ............ 361/679.01, 679.02, 679.32, 679.33; 439/502–506
See application file for complete search history.

(56) References Cited

U.S. PATENT DOCUMENTS

| 6,676,420 | B1 | 1/2004 | Liu et al. |
| 7,278,877 | B2 * | 10/2007 | Cho ....................... H01R 31/06 439/502 |

(Continued)

FOREIGN PATENT DOCUMENTS

| CN | 202242417 U | 5/2012 |
| CN | 202697055 U | 1/2013 |
| CN | 203465947   | 3/2014 |

OTHER PUBLICATIONS

European Search Report mailed Jan. 7, 2016, for European Patent Application No. 15181501.6, 10 pages.
(Continued)

*Primary Examiner* — Anthony Haughton
(74) *Attorney, Agent, or Firm* — Perkins Coie LLP

(57) ABSTRACT

A flash drive that can utilize space behind a mobile device is disclosed. In some embodiments, a body of the flash drive has three portions, a front portion, a back portion, and an intermediate portion that runs from the front portion to the back portion. A mobile device connector extends from a first end of the front portion, and a second connector extends from a second end of the back portion. The intermediate portion is configured to cause, when the mobile device connector is connected to the mobile device, the second connector and part of the back portion of the body to be located behind and, in some embodiments, adjacent to the back of the mobile device. This can enable part of the body to fit in a gap that can form between the back of the mobile device and a user's palm when the user holds the mobile device.

26 Claims, 21 Drawing Sheets

(51) Int. Cl.

| | | |
|---|---|---|
| *H05K 7/00* | (2006.01) | |
| *G06F 1/18* | (2006.01) | |
| *G06F 3/06* | (2006.01) | |
| *G06F 13/38* | (2006.01) | |
| *G06K 19/04* | (2006.01) | |
| *H05K 5/02* | (2006.01) | |
| *G11C 16/04* | (2006.01) | |
| *H01R 24/68* | (2011.01) | |
| *H01R 24/76* | (2011.01) | |
| *G06K 19/077* | (2006.01) | |

(52) U.S. Cl.
CPC ............ *G06F 3/0679* (2013.01); *G06F 13/38* (2013.01); *G06K 19/04* (2013.01); *G11C 16/04* (2013.01); *H01R 24/68* (2013.01); *H01R 24/76* (2013.01); *H05K 5/0278* (2013.01); *G06F 2206/1014* (2013.01); *G06K 19/07732* (2013.01); *G06K 19/07733* (2013.01); *H05K 5/026* (2013.01)

(56) References Cited

U.S. PATENT DOCUMENTS

| | | | |
|---|---|---|---|
| 7,300,306 B2* | 11/2007 | Le | ........................ H01R 13/60 439/502 |
| 7,494,343 B2 | 2/2009 | Schriefer et al. | |
| 7,722,369 B2* | 5/2010 | Bushby | .............. H01R 13/6397 439/134 |
| 2004/0105329 A1 | 6/2004 | Lin et al. | |
| 2005/0037647 A1 | 2/2005 | Le | |
| 2006/0198177 A1* | 9/2006 | Chang | ..................... G11C 5/04 365/52 |
| 2006/0252305 A1 | 11/2006 | Le et al. | |
| 2007/0254729 A1 | 11/2007 | Freund et al. | |
| 2008/0232054 A1 | 9/2008 | Chen et al. | |
| 2009/0009976 A1 | 1/2009 | Nishikawa et al. | |
| 2009/0181572 A1 | 7/2009 | Tracy et al. | |
| 2010/0069117 A1 | 3/2010 | Nighton | |
| 2010/0265712 A1 | 10/2010 | Singh et al. | |
| 2012/0140401 A1 | 6/2012 | Pomerantz et al. | |
| 2012/0151126 A1 | 6/2012 | Moore et al. | |
| 2013/0167226 A1 | 6/2013 | Lin | |
| 2013/0301199 A1 | 11/2013 | Whitt, III et al. | |
| 2013/0309901 A1* | 11/2013 | Hilbourne | ........... H01R 13/516 439/502 |
| 2014/0256192 A1 | 9/2014 | Joseph et al. | |
| 2014/0281139 A1 | 9/2014 | Smurthwaite | |
| 2015/0134893 A1 | 5/2015 | Anderson et al. | |

OTHER PUBLICATIONS

Philips DLP2276 Attachable Battery Pack for iPhone and iPod), [online], [retrieved on: May 11, 2016], Retrieved from: <http://www.amazon.com/Philips-DLP2276-Attachable-Battery-iPhone/dp/B0043RTM3C>, Sep. 15, 2010, 6 pages.

SanDisk iXpand™ Flash Drive User Guide, SanDisk Corporation, 951 SanDisk Drive, Milpitas, CA 95035, 2013, 25 pages.

Non-Final Office Action mailed May 11, 2016, for U.S. Appl. No. 14/602,226 of Anderson, J.L. et al., filed Jan. 21, 2015.

Search Report and Written Opinion mailed Apr. 28, 2016, for Singapore Patent Application No. 10201506373S, 12 pages.

Non-Final Office Action Mailed Jul. 26, 2016 in U.S. Appl. No. 14/602,226 of Anderson, Jon Lee et al. filed Jan. 21, 2015.

* cited by examiner

FLASH DRIVE SHAPED TO UTILIZE SPACE BEHIND A MOBILE DEVICE

CROSS-REFERENCE TO RELATED APPLICATIONS

This application is a continuation of U.S. patent application Ser. No. 14/602,226, entitled "FLASH DRIVE SHAPED TO UTILIZE SPACE BEHIND A MOBILE DEVICE", and filed on Jan. 21, 2015, which application claims the benefit from U.S. Provisional Patent Application No. 62/039,367, entitled "FLASH DRIVE SHAPED TO UTILIZE SPACE BEHIND A MOBILE DEVICE", and filed on Aug. 19, 2014. The contents of each which are incorporated herein by reference in their entirety.

BACKGROUND

Flash drives are devices that contain flash memory, which is a non-volatile memory, and that can be connected to computing devices, such as personal computers, smartphones, tablet computers, etc., via a standard connector. After connecting a flash drive to a first computing device via a standard interface, such as to a desktop computer via a full size Universal Serial Bus (USB) connector, a user can transfer data from the desktop computer to the flash drive using a set of standard protocols, such as for a USB mass storage device class. Because the data is stored in the non-volatile flash memory, the flash drive retains the data even when not connected to any computing device and not receiving any power. The flash drive can be connected to a second computing device that has the same standard connector and supports the same protocols, such as a laptop computer with a full size USB connector, and the data can be transferred from the flash memory of the flash drive to the laptop computer.

SUMMARY

Introduced herein is technology to enable a flash drive to utilize the space behind a mobile device. Flash drive users connect their flash drives to a variety of mobile devices, such as smart phones, tablet computers, portable music devices, etc. The users utilize their flash drives to transfer data between devices, backup data on their devices, synchronize their devices, etc. Many flash drives have an elongated rectangular shape. When connected to a mobile device, such as when connected to a connector on the bottom edge of a smart phone, the flash drive can extend from the mobile device in the elongated dimension. A flash drive can extend a distance from the bottom edge of the smart phone.

The further an accessory, such as a flash drive, extends out past a mobile device, the greater the chances are that the flash drive will experience unexpected force. Such an unexpected force can possibly damage the flash drive or the connection port of the mobile device. For example, the flash drive can act as a lever. A force applied at the end of the flash drive that extends from the mobile device can be amplified by the lever, and can create a significant amount of force on the connection port. This force can possibly cause damage to the connection port of the smart phone, or the connector of the flash drive.

While observing people as part of developing this technology, it was noticed that, when holding their smart phones vertically in their hand, users often held their phones between the base of their fingertips and the inner side of the hand. When holding a smart phone in this way, it was further noticed that many smart phone users would move their pinky finger to the bottom of the phone to stabilize it. When a user holds a smart phone in this way, and slides his pinky finger to the bottom of the phone to stabilize the phone, it was noticed that an empty space is created between the back of the phone and the palm of the user's hand.

In one embodiment, a flash drive has a J-shape, and has connectors on both ends of the J-shape. An Apple™ Lightning™ connector extends from the short end of the J-shape, and a full size Universal Serial Bus (USB) connector extends from the long end of the J-shape. A user inserts the Lightning connector of the flash drive into a compatible connection port of an Apple iPhone™, which is located on the bottom edge of the iPhone. When the user inserts the Lightning connector of the flash drive into the connection port, the long J-shaped end of the flash drive can wrap around to the back side of the iPhone. Thus, the USB connector and a portion of the long J-shaped end of the flash drive can be located behind the iPhone.

When a user holds the smart phone and creates the empty space between his palm and the smart phone as described above, the portion of the flash drive that is located behind the smart phone can fit in this empty space. When users similarly hold some other mobile devices, a similar empty space can be formed between the mobile device and the user's hand, and the long end of the J-shaped flash drive can similarly fit in this empty space.

Many users purchase cases for their smart phones and other mobile devices. These cases are placed over the mobile device to protect the mobile device. Such cases typically have holes in them that align with certain points on the mobile device. For example, one hole may align with a connector port, and a second hold may align with a earphone jack. These holes vary in size based on the case and the case manufacturer, with some cases having holes that are only slightly larger than the connector port opening.

As a result, connecting a flash drive to a phone encapsulated within a case can be difficult, as the connector end of the flash drive may be too large to fit in a smaller case hole. The size of the connector end of a flash drive may need to be sufficiently large to accommodate a printed circuit board (PCB) that includes, for example, a flash memory integrated circuit (IC) and one or more controller ICs, as well as other components. Such a PCB may cause the size of the connector end of the flash drive to be large enough to cause problems fitting in some of the smaller case holes.

In some embodiments, a PCB that includes the various ICs and components is located in the long end of a J-shaped flash drive. Because the short end of the J-shaped flash drive does not include this PCB, it can be made more narrow than the end of, for example, a rectangular shaped flash drive. Resultantly, the J-shaped flash drive can be reliably connected to a mobile device with a case, as the narrow short end of the J-shaped flash drive enables the flash drive to fit in the above discussed smaller case holes.

Users connect flash drives to a variety of mobile devices with a variety of thicknesses. When a J-shaped flash drive is connected to one mobile device, the back of the device may be located, e.g., 2 millimeters (mm) from the device connector. When connected to a second mobile device, the back of the device may be located 4 mm from the device connector. Further, cases can add to the thicknesses of these devices, so the 4 mm space of the second device may increase to 5 mm due to the thickness of the added case.

To enable the flash drive to connect to and accommodate a variety of device thicknesses, in some embodiments, the U-shaped intermediate portion of the J-shaped flash drive is flexible. Due to this flexibility, the distance between the two ends of the J-shaped flash drive can be increased by pulling apart the two ends. The flexibility of the U-shaped intermediate portion enables the U-shaped intermediate portion to bend, when enables the two ends to separate enough to accommodate a thicker mobile device. This enables the long end of the J-shaped flash drive to wrap around and fit behind thicker devices, as well as narrower devices.

BRIEF DESCRIPTION OF THE DRAWINGS

One or more embodiments are illustrated by way of example in the figures of the accompanying drawings, in which like references indicate similar elements.

DETAILED DESCRIPTION

In this description, references to "an embodiment," "one embodiment," "an implementation," or the like, mean that the particular feature, function, structure or characteristic being described is included in at least one embodiment of the technique introduced here. Occurrences of such phrases in this specification do not necessarily all refer to the same embodiment. On the other hand, the embodiments referred to also are not necessarily mutually exclusive. Additionally, the term "module" refers broadly to software, hardware, or firmware (or any combination thereof) components. Modules are typically functional components that can generate useful data or other output using specified input(s). A module may or may not be self-contained. An application program (also called an "application") may include one or more modules, or a module can include one or more application programs.

Further, the term "cause" and variations thereof refer to either direct causation or indirect causation. For example, a computer system can "cause" an action by sending a message to a second computer system in order to command, request, or prompt the second computer system to perform the action. Any number of intermediary devices may examine and/or relay the message during this process. In this regard, a device can "cause" an action even though it may not be known to the device whether the action will ultimately be executed.

Additionally, a protocol, such as the USB protocol, may include any of a set of protocols, may include any of various versions of the protocols, may include any of various classes of devices, etc., as would be appreciated by a person of ordinary skill in the art. For example, the USB protocol may include any of the USB mass storage device class, the USB human interface device class, etc., may include any of USB version 1.0, USB version 2.0, USB version 3.0, etc. Further, supporting the protocol may include supporting only a portion of the protocol. For example, supporting the protocol may include supporting only a portion of the set of protocols, only a portion of the various versions of the protocol, only a portion of the classes of devices, etc., or even supporting only a portion of one of the set of protocols.

Figure 1:
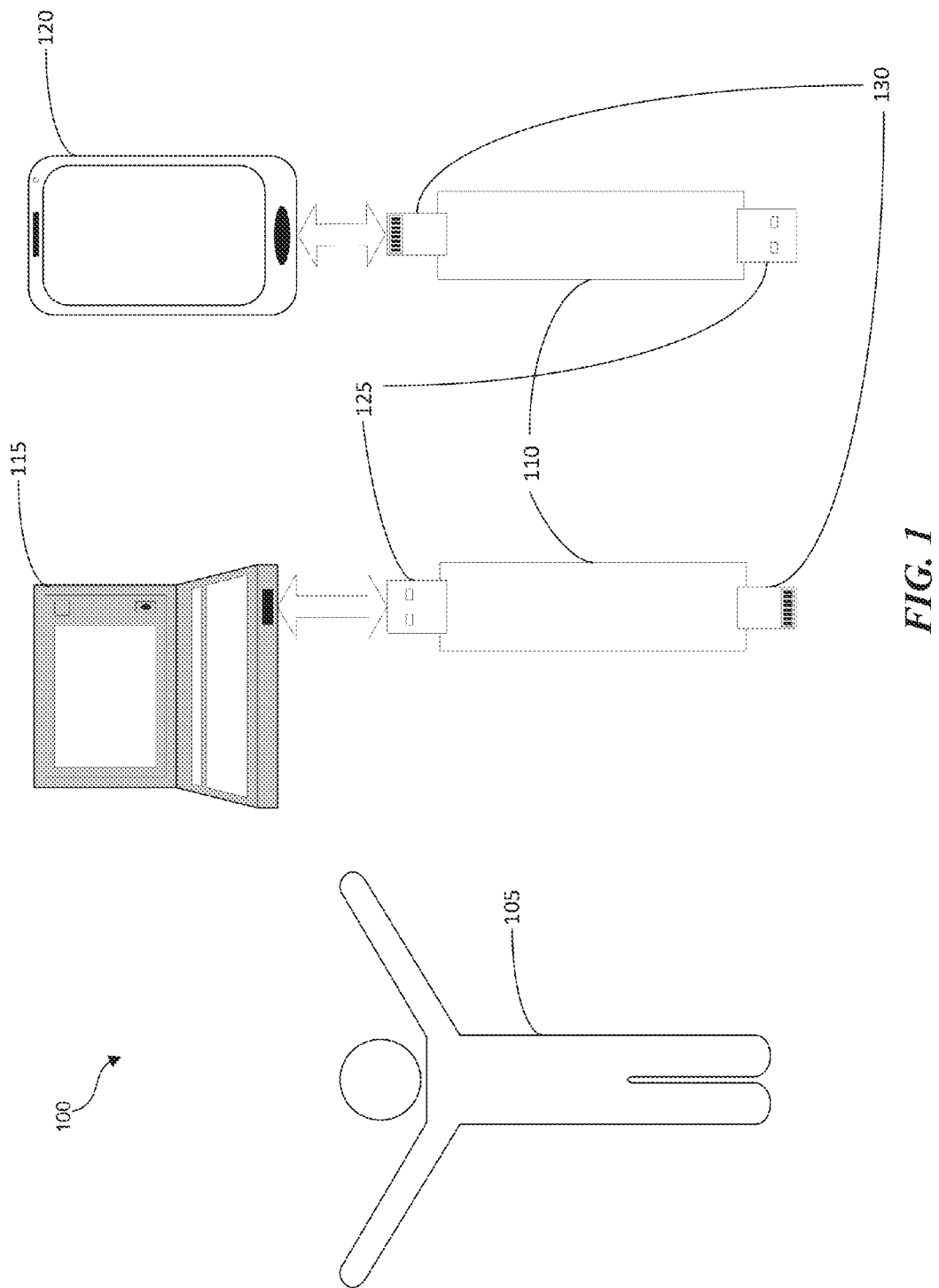
FIG. 1 is an environment diagram illustrating an environment in which a flash drive is used, consistent with various embodiments.

FIG. 1 is an environment diagram illustrating an environment in which a flash drive is used, consistent with various embodiments. In the embodiment of environment 100, user 105 has flash drive 110 and desires to transfer data from laptop 115 to smartphone 120. In this embodiment, laptop 115 runs the Microsoft Windows operating system (Windows), includes a standard full size USB port, and supports the USB protocol. In various embodiments, laptop 115 and/or smartphone 120 can be any computer system that runs an operating system that supports a USB mass storage protocol, such as Android, iOS, MacOS, OS X, Unix, HP-UX, Solaris, BSD, Linux, etc. The operating system can be a real-time operating system, such as LynxOS, RTLinux, VxWorks, Windows CE, FreeRTOS, etc. Returning to the embodiment of FIG. 1, user 105 can plug USB connector 125 into the USB port of laptop 115. Once connected, laptop 115 recognizes flash drive 110 as a USB device, and establishes communication. User 105, using the Windows interface, initiates a copy command to copy some data, such as a movie, from the hard disk of laptop 115 to flash drive 110.

After the movie is copied to the flash drive, user 105 removes USB connector 125 from the USB port of laptop 115, and plugs Lightning connector 130, which is a standard Apple Computer™ (Apple) connector, into smartphone 120, which is an Apple device that runs iOS. Once connected, smartphone 120 recognizes flash drive 110 as an Apple compatible device, and establishes communication. User 105, using the iOS interface, initiates a copy command to copy the movie from flash drive 125 to smartphone 120.

Figure 2:
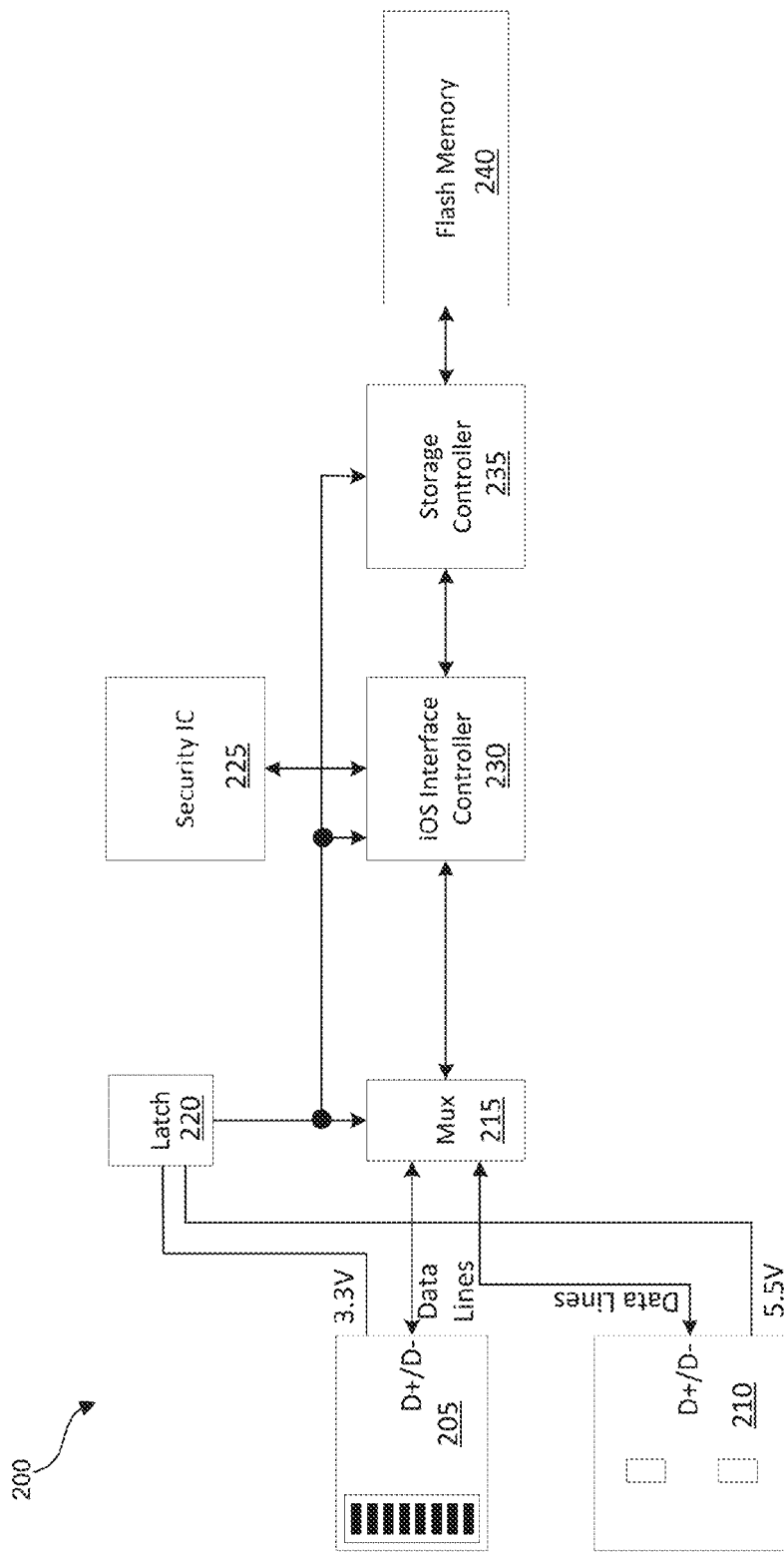
FIG. 2 is a block diagram illustrating an example of a flash drive that utilizes two controller modules for two sets of functionality, consistent with various embodiments.

FIG. 2 is a block diagram illustrating an example of a flash drive that utilizes two controller modules for two sets of functionality, consistent with various embodiments. Flash drive 200 includes first connector 205, second connector 210, mux 215, latch 220, Security IC 225, iOS interface controller 230, storage controller 235, and flash memory 240. Storage controller 235 is utilized for a first set of functionality that includes handling the USB protocol and managing communication with flash memory 240. iOS interface controller 230 is utilized for a second set of functionality that includes Apple iOS specific processing and communicating with a security IC or module. In the embodiment of FIG. 2, first connector 205, second connector 210, mux 215, latch 220, Security IC 225, iOS interface controller 230, storage controller 235, and flash memory 240 are each separate components that are connected to a printed circuit board (PCB, not shown), and the PCB electrically connects the connection points, also referred to as pins, of the various components. Further, Security IC 225, iOS interface controller 230, storage controller 235, and flash memory 240 are each integrated circuits (ICs). While 225-240 are separate ICs in this embodiment, in other embodiments, any and/or all of 225-240, as well as mux 215 and latch 220, can be integrated into one or more ICs.

In the embodiment of FIG. 2, first connector 205 is a standard Apple connector, such as an Apple Lightning connector, an Apple 30-pin connector, or an Apple Thunderbolt connector, and can be used to connect to a computing device that runs iOS. Second connector 210 is a standard connector for a non-iOS computing device (i.e. a computing device running an operating system other than any version of iOS), such as a full size USB connector, a standard USB connector, a standard A-type USB connector, a B-type USB connector, a mini USB connector, a mini USB A-type connector, a mini USB B-type connector, a micro USB connector, a micro USB A-type connector, a micro USB B-type connector, or a UC-E6 connector. Second connector 210 can be used to connect to a non-iOS computing device, and, in some embodiments, can be used to connect to a computing device that runs iOS. A standard connector can be an above described standard Apple connector, or an above described standard connector for a non-iOS computing device, or any other industry standard connector. In various embodiments, first connector 205 is a first type of standard connector, and second connector 210 is a second type of standard connector.

Returning to the example of FIG. 1, Lightning connector 130 can be first connector 205, and USB connector 125 can be second connector 210. Using the example of FIG. 1, user 105 can plug second connector 210 into the USB port of laptop 115. Once connected, a power pin of second connector 210 is electrically connected to the 5.5V power supply of laptop 115, and the power pin transmits the 5.5V to latch 220.

At this point, the power pins of first connector 205 are unconnected. Latch 220, which can be a cross-coupled NAND latch, detects that the 5.5V power pin from second connector 210 is active, and that the 3.3V power pin from first connector 205 is inactive. Latch 220 is set to a second value to indicate that second connector 210 is active (i.e. to indicate that reads and writes of the flash drive will go through this connector). The output of latch 220 is electrically connected to the select input of mux 215, and when the select input is set to the second value, the mux selects the data pins of second connector 210 to send to iOS interface controller 230. The output of latch 220 is also electrically connected to iOS interface controller 230 and storage controller 235. When the output of latch 220 is set to the second value, iOS interface controller 230 and storage controller 235 can sample the output of latch 220 to determine whether second connector 210 is active.

Components 215-240 can be powered by the appropriate power supply pin (e.g. the 3.3V power pin of first connector 205, the 5.5V power pin of second connector 210, by a combination of the two power pins, by a different power pin of first connector 205 or second connector 210, etc.). Once components 215-240 are powered up, the components go through a reset sequence, which initializes the components and begins the execution of an application program that is stored in flash memory 240 to effectively "boot" the flash drive into a ready state.

At some point after the flash drive is in the ready state, laptop 115 sends a USB protocol message to flash drive 200 to initiate communication. The USB protocol message passes through mux 215 to iOS interface controller 230, which relates the USB protocol message to storage controller 235. Storage controller 235 is configured, via customization of the IC design of storage controller 235, and/or via software that storage controller 235 executes, to communicate using the USB protocol. Storage controller 235 receives and recognizes the USB commands, and acts accordingly to establish a communication channel between laptop 115 and flash drive 200. User 105, using the Windows interface, initiates a copy command to copy some data, such as a movie, from the hard disk of laptop 115 to flash drive 110. Laptop 115, utilizing a series of USB commands, sends the movie via second connector 210 and mux 215 to iOS interface controller 230, which forwards the data to storage controller 235, which acts according to the USB commands and writes the movie to flash memory 240.

Storage controller 235 is also configured, via customization of the IC design of storage controller 235, and/or via software that storage controller 235 executes, to manage communications with flash memory 240. Storage controller 235 can be a module that is optimized to manage communications with a flash memory, which includes managing the reading of data from, the writing of data to, and the erasing of data at the flash memory. Managing communications with a flash memory can require certain capabilities, such as the ability to manage the data of the flash memory in order to properly handle "erase blocks." Flash memory, such as flash memory 240, can be NAND or NOR flash, and can have "erase blocks", an erase block being the smallest unit of flash memory that can be erased at a time. Erase blocks are substantially larger than the smallest unit of memory that can be read or written. For example, NAND flash memory can be read or written in a random access fashion in units typically sized in the range of 2 KB to 4 KB. However, an erase block may be on the order of 128 KB or 256 KB or even larger.

As a result, when getting ready to erase data or commands from flash memory 240, storage controller 235 needs to be capable of ensuring that only data that is intended to be erased is actually erased. Storage controller 235 can ensure this by managing the data so that the erase block of flash memory 240 to be erased contains exclusively data to be erased. Storage controller 235 can also ensure this by reading the data or commands that are in the erase block to be erased, but are not intended to be erased, and storing the data or commands in temporary storage memory, which can be part of storage controller 235 or can be part of another module. Storage controller 235 can then safely erase the erase block containing the mix of to be erased and not to be erased data/commands. Once the erase block is erased, the data/commands that are not intended to be erased can be read from temporary storage memory and written back to flash memory 240.

After the movie is copied to flash drive 200, user 105 unplugs flash drive 200 from laptop 115. At this point there is no power connected to any of components 205-240. However, being a non-volatile memory, flash memory 240 retains the data that was written to it.

Later, first connector 205 is connected to smartphone 120 and the power pin of first connector 205 is electrically connected to the 3.3V power supply of smartphone 120. At this point, the power pins of second connector 210 are unconnected. Latch 220 detects that the 3.3V power pin from first connector 205 is active, and that the 5.5V power pin from second connector 210 is inactive, and latch 220 is set to a first value to indicate that first connector 205 is active. Mux 215, based on the mux select being set to the first value, selects the data pins of first connector 205 to send to iOS interface controller 230. iOS interface controller 230 and storage controller 235, based on the output of latch 220, can determine whether first connector 205 is active. The flash drive "boots" as previously described. At some point after the flash drive is in the ready state, smartphone 120 sends a Peripheral Protocol message to flash drive 200 to initiate communication.

A Peripheral Protocol is a protocol and/or set of commands that enables a peripheral device, such as flash drive 200, to communicate with an iOS device. An iOS device is a computing device that runs any version of iOS. Even when two devices have physically compatible connectors, the two devices may not be compatible, for example, due to incompatible communication protocols. For example, while an Apple computing device running iOS may have a full size USB connector, the Apple computing device may have an incompatible communication protocol. When a user plugs the flash drive into the full size USB connector of the Apple computing device, the Apple computing device may display a message stating that the flash drive is an unrecognized or unsupported device. This may be because the Apple computing device doesn't recognize devices that support only the mass storage class USB protocols, even though the device is connected via a standard USB connector.

As a result of having incompatible communication protocols, the flash drive cannot be used to send data to or obtain data from the incompatible Apple computing device, even though the flash drive and the Apple computing device can be connected via a physically compatible connector. In such a case, the Apple computing device may require that the peripheral device support the Peripheral Protocol in addition to the USB mass storage class protocols. The Peripheral Protocol can be, for example, an Apple proprietary peripheral protocol, details of which may be available under Apple's MFi licensing program. Examples of Peripheral Protocols include the accessory protocols referred to in U.S. Pat. No. 8,590,036 entitled "Method and system for authenticating an accessory," which was filed on Jan. 10, 2012.

To be compatible with a peripheral device, the Apple computing device can further require that the peripheral device support an authentication scheme that requires the peripheral to include a Security IC, such as security IC 225. A Security IC is an IC that can receive a message from a computing device, such as an iOS device, and can provide a response to the computing device, enabling the computing device to authenticate the peripheral device that includes the Security IC.

Returning to the example, the Peripheral Protocol message passes through mux 215 to iOS interface controller 230. iOS interface controller 230 is configured, via customization of the IC design of iOS interface controller 230, and/or via software that iOS interface controller 230 executes, to communicate using the Peripheral Protocol. iOS interface controller 230 receives and recognizes the Peripheral Protocol commands. In order to establish a communication channel with an Apple iOS device, such as smartphone 120, flash drive 200 can be authorized by smartphone 120. Smartphone 120 sends a message to initiate the authorization process, in response to which iOS controller 130 communicates with Security IC 225 to obtain authentication data. Security IC 225 sends the authentication data to iOS interface controller 230, which forwards the authentication data to smartphone 120 to authorize the flash drive and enable data transfers between the flash drive and smartphone 120.

User 105, using the iOS interface, initiates a copy command to copy the movie from flash drive 200 to smartphone 120. Smartphone 120, utilizing a series of commands, which can include either USB commands, which are handled by storage controller 235, or Peripheral Protocol commands, which are handled by iOS interface controller 230, or both USB and Peripheral Protocol commands, initiates the copy of the movie. Storage controller 235 reads the movie from flash memory 240 and sends the movie to iOS interface controller 230, which forwards the movie via mux 215 and first connector 205, to smartphone 120.

Figure 3:
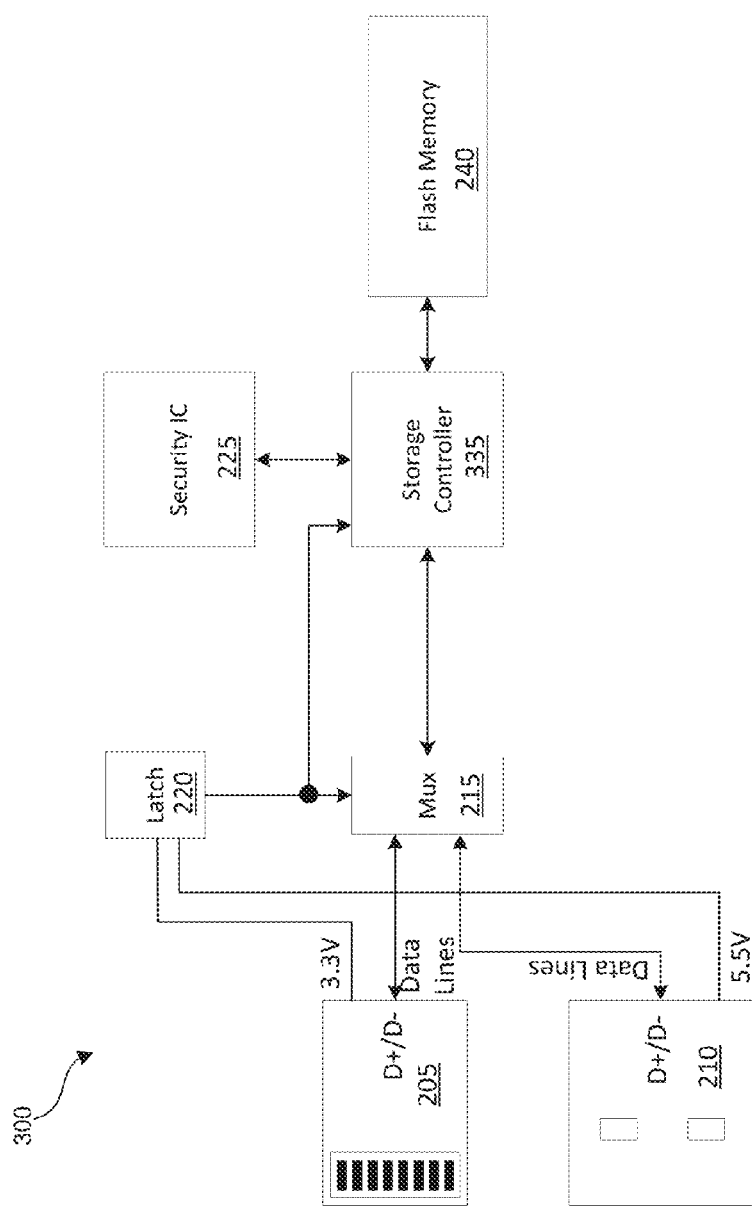
FIG. 3 is a block diagram illustrating an example of a flash drive that integrates the two sets of functionality using one controller module, consistent with various embodiments.

FIG. 3 is a block diagram illustrating an example of a flash drive that integrates the two sets of functionality using one controller module, consistent with various embodiments. Flash drive 300 includes first connector 205, second connector 210, mux 215, latch 220, Security IC 225, storage controller 335, and flash memory 240. In some embodiments, storage controller 335 is the same as, or has the same functionality as, storage controller 235. Storage controller 335 is utilized for a first set of functionality that includes handling the USB protocol and managing communication with flash memory 240, as well as for a second set of functionality that includes Apple iOS specific processing and communicating with a Security IC. The second set of functionality was, in the embodiment of FIG. 2, handled by iOS interface controller 230, which is notably not included in flash drive 300. In various embodiments, the first set of functionality includes handling a communication protocol other than the USB protocol, and managing communication with flash memory 240. The second set of functionality includes handling a communication protocol, such as an Apple peripheral protocol, and communicating with a Security IC.

In the embodiment of FIG. 3, first connector 205, second connector 210, mux 215, latch 220, Security IC 225, storage controller 335, and flash memory 240 are each separate components that are connected to a PCB (not shown), and the PCB electrically connects the pins of the various components. Further, Security IC 225, storage controller 335, and flash memory 240 are each integrated circuits (ICs). While Security IC 225, storage controller 335, and flash memory 240 are separate ICs in this embodiment, in other embodiments, any and/or all of Security IC 225, storage controller 335, and flash memory 240, as well as mux 215 and latch 220, can be integrated into one or more ICs.

Once again referring to the example of FIG. 1, flash drive 300 would handle copying the movie from laptop 115, and sending the movie to smartphone 120, in a way similar to flash drive 200, with some notable differences that are the result of or that enable integrating the two sets of functionality using storage processor 335. The processing that is handled by iOS interface controller 230 and storage controller 235 of FIG. 2 can be handled by storage controller 335 of FIG. 3. As was storage controller 235 in the example of FIG. 2, storage controller 335 is configured, via customization of the IC design of storage controller 335, and/or via software that storage controller 335 executes, to communicate using the USB protocol, as well as to manage communications with flash memory 240. Unlike storage controller 235 in the example of FIG. 2, storage controller 335 is also configured, via customization of the IC design of storage controller 335, and/or via software that storage controller 335 executes, to communicate using the Peripheral Protocol and to communicate with Security IC 225. When storage controller 335 is configured via software and not via customization of the IC design of storage controller 335, storage controller 335 can be the same as or have the same functionality as storage controller 235.

Figure 4:
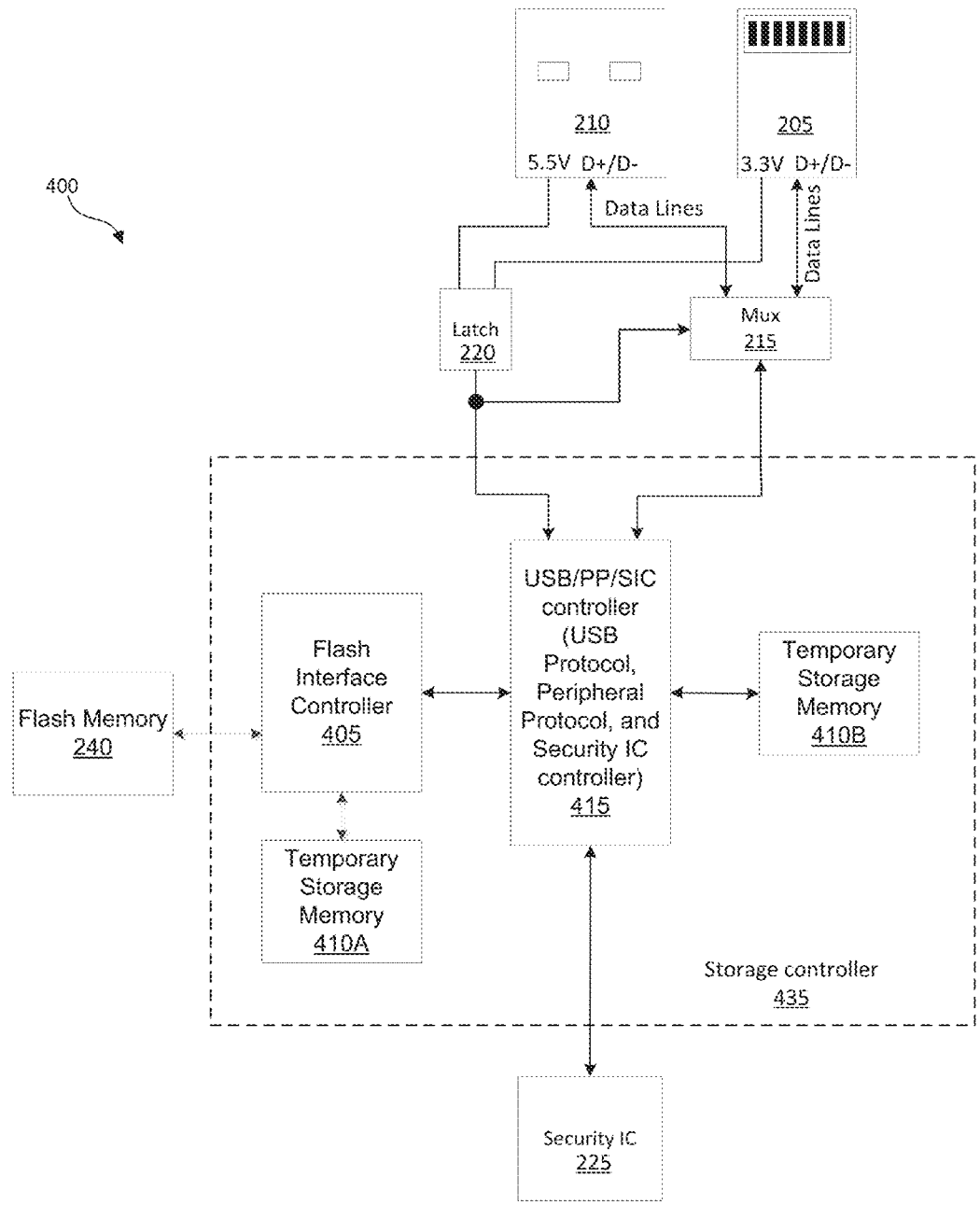
FIG. 4 is a block diagram illustrating an example of a flash drive that integrates the two sets of functionality via customization of the IC design of a storage controller, consistent with various embodiments.

FIG. 4 is a block diagram illustrating an example of a flash drive that integrates the two sets of functionality via customization of the IC design of a storage controller, consistent with various embodiments. Flash drive 400 includes first connector 205, second connector 210, mux 215, latch 220, Security IC 225, storage controller 335, flash interface controller 405, temporary storage memory 410, USB/PP/SIC controller 415, and flash memory 240. In some embodiments, storage controller 435 is the same as, or has the same functionality as, storage controller 335 of FIG. 3.

In the embodiment of FIG. 4, storage controller 435 is utilized for a first set of functionality that includes handling the USB protocol and managing communication with flash memory 240, as well as for a second set of functionality that includes Apple iOS specific processing and communicating with a Security IC. A sub-module of storage controller 435, flash interface controller 405, manages communication with flash memory 240, and a second sub-module of storage controller 435, USB/PP/SIC controller 415, handles the USB protocol, Apple iOS specific processing, and communicating with the Security IC.

While FIG. 4 illustrates the two sets of functionality being integrated via customization of the IC design of a storage controller, the functionality can equivalently be integrated via customized software that is executed by a programmable IC, such as a microcontroller or application specific integrated circuit (ASIC), or via a combination of a customized IC design and customized software. Also referred to as modules, the blocks of the customized IC of FIG. 4 can have equivalent modules in customized software when the functionality is integrated via the customized software.

Once again referring to the example of FIG. 1, flash drive 400 of the embodiment of FIG. 4 would handle copying the movie from laptop 115, and sending the movie to smartphone 120, in a way that can be similar to or the same as flash drive 300 of FIG. 3. After flash drive 400 is connected to laptop 115 and is in the ready state, the movie copy can be initiated by laptop 115 sending a message, such as a USB protocol message, to flash drive 400 to initiate communication and to send the first data of the movie. The first data can pass through second connector 210 and mux 215 to storage controller 435, where it passes to sub-module USB/PP/SIC controller 415. When USB/PP/SIC controller 415 receives the first data, it can store the first data in temporary storage memory 410B, to which it is connected.

Flash memory can be read or written in a random access fashion in units typically sized in the range of 2 KB to 4 KB, sometimes called blocks. The first data being copied from laptop 115 can be stored in temporary storage memory 410B until sufficient movie and/or other data has been received to trigger a write of a block of flash memory 240. The first data can alternately or additionally be sent to flash interface controller 405, where it can be stored in temporary storage memory 410A until sufficient movie and/or other data has been received to trigger a write of a block of flash memory 240.

Once sufficient data has been received to trigger a write, the temporary storage memory storing the movie and/or other data can be read and the data to be written to the block of flash memory 240 can be sent to flash interface controller 405. Flash interface controller 405 can write the data to the block of flash memory 240. Once the data is written to flash memory 240, the corresponding memory of the temporary storage memory holding the data can be made available for other purposes. Additionally, commands that are sent by laptop 115, such as USB commands, can also be stored in temporary storage memory 410B until USB/PP/SIC controller 415 is able to handle them appropriately.

After being disconnected from laptop 115, and connected to smartphone 120, flash drive 400 can send the movie to smartphone 120. The movie data to be sent resides in flash memory 240. At some point after the flash drive is in the ready state, smartphone 120 sends an Peripheral Protocol message to flash drive 400 to initiate communication. The Peripheral Protocol message passes through first connector 205 and mux 215 to storage controller 435, where the message passes to sub-module USB/PP/SIC controller 415. USB/PP/SIC controller 415 receives the Peripheral Protocol commands and can send the commands to temporary storage memory 410B until USB/PP/SIC controller 415 is ready to handle the commands.

As part of establishing a communication channel with flash drive 400, smartphone 120 sends a message to flash drive 400 to initiate an authorization process, in response to which USB/PP/SIC controller 415 communicates with Security IC 225 to obtain authentication data. Security IC 225 sends the authentication data to USB/PP/SIC controller 415, which forwards the authentication data to smartphone 120 to authorize flash drive 400 and enable data transfers between flash drive 400 and smartphone 120. In some embodiments, USB/PP/SIC controller 415 processes the authentication data before sending a message based on the processing of the authentication data to smartphone 120 to support authorization of flash drive 400 and enable data transfers between flash drive 400 and smartphone 120.

User 105, using the iOS interface, initiates a copy command to copy the movie from flash drive 400 to smartphone 120. Smartphone 120, utilizing a series of commands which can include either USB commands or Peripheral Protocol commands, both of which are handled by USB/PP/SIC controller 415, initiates the copy of the movie. USB/PP/SIC controller 415 sends a message to flash interface controller 405, in response to which flash interface controller 405 reads the movie from flash memory 240 and sends the movie to USB/PP/SIC controller 415, which forwards the movie via mux 215 and first connector 205, to smartphone 120.

In some embodiments, flash interface controller 405 can read the movie data to be sent from flash memory 240 and store the data in temporary storage memory 410A. Flash interface controller 405 can alternately, or additionally, send the movie data to USB/PP/SIC controller 415, which can store the movie data to be sent in temporary storage memory 410B. Once USB/PP/SIC controller 415 is ready to send the movie data to smartphone 120, it can read the movie data from temporary storage memory 410B and send the movie data to smartphone 120, or can receive the movie data directly from flash interface controller 405 and send the movie data to smartphone 120. Additionally, commands that are to be sent can be stored in temporary storage memory 410B until USB/PP/SIC controller 415 is ready to send the commands to the connected device.

Flash interface controller 405 can also manage the erasing of flash memory 240. As discussed earlier, flash memory has "erase blocks", an erase block being the smallest unit of flash memory that can be erased at a time. Erase blocks are substantially larger than the smallest unit of memory that can be read or written. For example, NAND flash memory can be read or written in a random access fashion in units typically sized in the range of 2 KB to 4 KB. However, an erase block may be on the order of 128 KB or 256 KB or even larger. As a result, when getting ready to erase data or commands from flash memory 240, a controller that manages communication with a flash drive, such as flash interface controller 405, should ensure that only data that is intended to be erased is actually erased. Flash interface controller 405 can ensure this by managing the data so that the erase block of flash memory 240 that is to be erased exclusively contains data to be erased. Flash interface controller 405 can also ensure this by reading the data or commands that are in the erase block to be erased, but are not intended to be erased, and by storing the data or commands in temporary storage memory 410B. Flash interface controller 405 can then safely erase the erase block containing the mix of to be erased and not to be erased data/commands. Once the erase block is erased, the data/commands that are not intended to be erased can be read from temporary storage memory 410B and written back to flash memory 240.

Those skilled in the art will appreciate that the logic illustrated in FIGS. 1-4 and described above, and in the activity diagram discussed below, may be altered in a various ways. For example, the order of the logic may be rearranged, substeps may be performed in parallel, illustrated logic may be omitted, other logic may be included, etc. Further, the scope of the disclosed technique also includes embodiments implementing the described functionality in these various other ways. Accordingly, the scope of the disclosed technique is intended to embrace all such alternatives, modifications, and variations as fall within the scope of the claims, together with all equivalents thereof.

Figure 5:
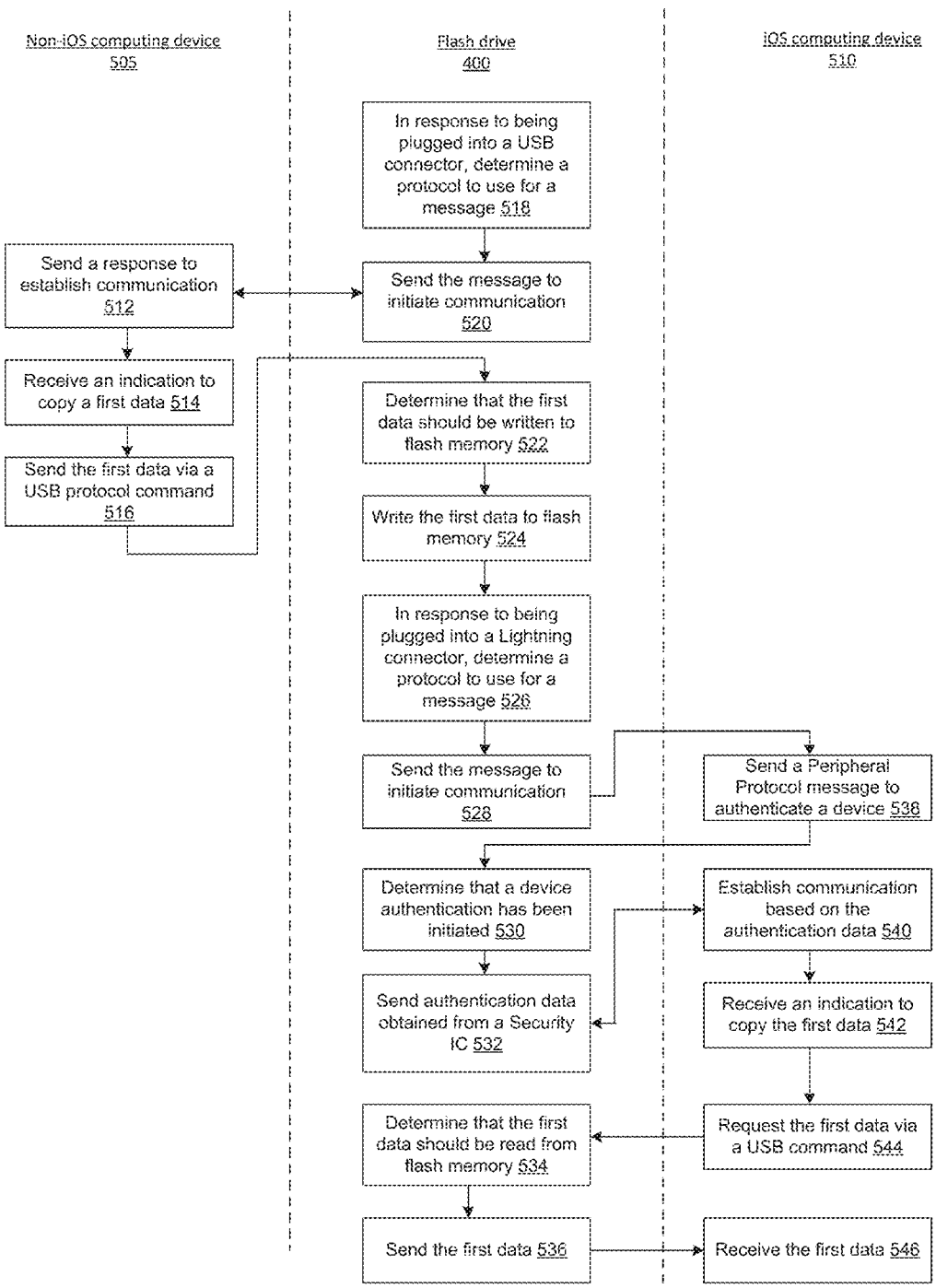
FIG. 5 is an activity diagram illustrating the use of a flash drive to copy data from a non-iPhone Operating System (iOS) computing device to an iOS computing device, consistent with various embodiments.

FIG. 5 is an activity diagram illustrating the use of flash drive 400 to copy data from non-iOS computing device 505 (NCD 505) to iOS computing device 510 (ICD 510), consistent with various embodiments. NCD 505 is a computing device that is not running iOS, such as laptop 115, and ICD 510 is a computing device that is running iOS, such as smartphone 120. While this diagram illustrates using flash drive 400 to copy data from NCD 505 to ICD 510, data can similarly be copied from ICD 510 to NCD 505 using flash drive 400.

A user, such as user 105, plugs a connector of flash drive 400, such as a male USB connector, into a compatible connector of NCD 505, such as a female USB connector. After being plugged in, flash drive 400 powers up and goes through a reset sequence where it in initialized and put in a ready state. In some embodiments, during the initialization process flash drive 400 reads and executes software from flash memory 240. For example, after going through the reset sequence, flash interface controller 405 reads data from flash memory 240. The data can be software to be executed by either flash interface controller 405 or USB/PP/SIC controller 415. The software can be executed to put flash drive 400 into a ready state.

Once flash drive 400 is in the ready state, either flash drive 400 or NCD 505 can initiate communication between the two devices. In response to being plugged into the USB connector of NCD 505 and effectively "booting" to the ready state, flash drive 400 can determine a protocol to use to send a message to NCD 505 to initiate communication between the devices (step 518). For example, flash drive 400 can determine, based on being plugged into a USB connector, to send a USB command or message to NCD 505 to initiate communication (step 520). In response to receiving the USB command or message, NCD 505 can send a response to establish communication between the devices (step 512). In some embodiments or cases, NCD 505 can send the message to initiate communication to flash drive 400, and flash drive 400 can send a response to establish communication.

At some point in time, user 105 indicates that he wants to copy data, such as a movie, from NCD 505 to flash drive 400. For example, user 105 can utilize a user interface of a non-iOS operating system that is running on NCD 505, such as the Windows operating system running on laptop 115, to indicate to copy the movie to flash drive 400 (step 514). NCD 505 can send the movie to flash drive 400 using the USB protocol and USB protocol commands (step 516). Flash drive 400 receives the commands at USB/PP/SIC controller 415, where the USB commands are interpreted. Based on the received USB commands, USB/PP/SIC controller 415 determines to write the movie data to flash memory 240 (step 522), and can forward the movie data to flash interface controller 405, which manages the writing of the data to flash memory 240 (step 524). After the movie data is written to flash drive 400, user 105 unplugs flash drive 400 from the USB connector of NCD 505.

At a later point in time, user 105 plugs a connector of flash drive 400, such as a male Lightning connector, into a compatible connector of NCD 510, such as a female Lightning connector. After being plugged in, flash drive 400 powers up and goes through a reset sequence; in which it is initialized and put in a ready state. Once flash drive 400 is in the ready state, either flash drive 400 or NCD 510 can initiate communication between the two devices. In response to being plugged into the Lightning connector of NCD 510 and effectively "booting" to the ready state, flash drive 400 can determine a protocol to use to send a message to NCD 510 to initiate communication between the devices (step 526). For example, flash drive 400 can determine, based on being plugged into a Lightning connector, to send a Peripheral Protocol command or message to NCD 510 to initiate communication (step 528). In response to receiving the Peripheral Protocol command or message, NCD 510 can send a Peripheral Protocol message to authenticate flash drive 400 (step 538).

Upon receiving the Peripheral Protocol message, flash drive 400 determines that a device authentication has been initiated (step 530). The Peripheral Protocol message is received by USB/PP/SIC controller 415, where the Peripheral Protocol commands are interpreted. USB/PP/SIC controller 415 determines that an authentication has been initiated (step 530), and USB/PP/SIC controller 415 sends a message to Security IC 225 to obtain authentication data. Security IC 225 sends the authentication data to USB/PP/SIC controller 415, which forwards the authentication data to NCD 510 (step 532) to authorize flash drive 400 to enable data transfers between flash drive 400 and NCD 510. In some embodiments, USB/PP/SIC controller 415 processes the authentication data before sending transformed data to NCD 510 to authorize flash drive 400. After receiving the authorization data (or, in some embodiments, the transformed data), NCD 510 uses the authentication data to validate that flash drive 400 is an authorized device. Once authorized, NCD 510 sends a response to establish communication with flash drive 400 (step 540).

At a later point in time, user 105 indicates that he wants to copy or stream the movie from flash drive 400 to ICD 510. For example, user 105 utilizes a user interface of the iOS that is running on ICD 510, such as smartphone 120, to indicate to copy or stream the movie from flash drive 400 to ICD 510 (step 542). In response to the indication to copy or stream the movie, ICD 510 sends a request for the movie to flash drive 400 (step 544) by sending, e.g., a USB command requesting movie data to flash drive 400, where the command is directed to USB/PP/SIC controller 415, where the USB command is interpreted. Based on the received USB command, USB/PP/SIC controller 415 determines to read the movie data from flash memory 240 (step 534), and forwards the read request to flash interface controller 405, which manages the reading of the movie data from flash memory 240. After reading the movie data from flash memory 240, flash interface controller 405 sends or streams the movie data to USB/PP/SIC controller 415, which sends or streams the data to ICD 510 (step 536), where the data is received (step 546).

In some embodiments where storage controller 435 is configured, via software that storage controller 435 executes, to integrate the various functionality that is implemented on iOS interface controller 230 and storage controller 235 of FIG. 2, a number of issues make successful integration challenging. For example, storage controller 435 may be the same as or have the same functionality as storage controller 235, which is not utilized (in the embodiment of FIG. 2) to handle Peripheral Protocol communication, nor to handle communications with Security IC 225. Further, when handling data transfer in software at the data transfer application level, the data transfer application may not be notified of error detection made at a lower level, such as by USB level commands, and/or the error detection may not be visible to the data transfer application. As a result, implementing these functions via software that is executed by storage controller 435 may be quite challenging. For example, storage controller 435 may not have the performance capacity needed to handle streaming a movie to a computing device for display on the computing device, or may not be able to properly handle errors that occur during transmission of the data.

To overcome a performance limitation, in some embodiments, a Connected Peripheral (CP) channel can be logically created in order to enable the use of Small Computer System Interface (SCSI) commands. A CP channel is a communication channel between two components that enables the two components to communicate using a protocol and/or commands beyond those of the Peripheral Protocol. For example, to overcome performance limitations of using a module not designed to implement the Peripheral Protocol, such as storage controller 435, a CP channel can be implemented in order to enable Small Computer System Interface (SCSI) commands to be used. Storage controller 435, being designed for data storage applications, supports SCSI commands, which are not supported by the Peripheral Protocol. By setting up a CP channel, these much higher performance SCSI commands can be used to speed up the data transfer by as much as an order of magnitude, as compared to executing the data transfer using only the protocol and/or commands of the Peripheral Protocol.

To implement the CP channel, storage controller 435 can be configured to create two USB end points to use for the CP channel, one logically at flash drive 400 and a second at ICD 510. Once established, the CP channel can be used to send data using commands other than USB commands. For example, storage controller 235 may be designed and optimized for storage applications, and may support high performance data transfer commands, such as SCSI commands. The CP channel can be used to transfer the movie data from flash drive 400 to ICD 510, and/or from ICD 510 to flash drive 400, using SCSI commands. By utilizing SCSI commands, data transfer rates may be increased by an order of magnitude or even more.

To overcome an issue caused by a data transfer application that handles data transfer to/from flash drive 400 not being notified of transmission errors, or the transmission errors not being visible to the data transfer application, these errors can be detected at the data transfer application level. For example, the USB protocol can include a cyclic redundancy checksum (CRC), which can be checked at the USB protocol level. If an error is detected by the CRC, because this error is detected at a lower level than the data transfer application, the data transfer application may not be notified of the error, and/or the error may not be visible to the data transfer application. Examples of other standard USB error detection mechanisms include detection of an invalid Product ID (PID) sequence, detection of a missed packed, detection of a token packet without a corresponding detection of a data packet that corresponds to the token packet within a bus transaction timeout period, etc. Other standard USB error detection mechanisms can be those called for by a USB specification, such as the USB 1.0, 1.1, 2.0, 3.0, 3.1, etc. versions of the USB specification.

To address this issue, in some embodiments, a check to detect errors that would be detected by a standard USB error detection mechanism can be implemented at the data transfer application level, and the errors can be detected and fixed prior to being checked by the standard USB error detection mechanism. By doing this, errors that would otherwise be detected by a lower level USB error detections mechanism, such as the CRC, can be detected and addressed at the data transfer application level. Further, by fixing the data before the USB error detection mechanism is utilized to detect errors, the data transfer application can ensure that no errors are present that would otherwise be detected by the USB error detection mechanism, and the issues related to errors being detected at the lower level can be bypassed.

As one example of the error issue, iOS may not allow a storage device, such as flash drive 400, to be recognized as a storage device when plugged into a connector, such as a Lightning connector. When flash drive 400 is plugged into, for example, a computing device that runs the Android operating system (OS), flash drive 400 can be recognized as a storage device by the Android OS. As a result, much of the data transmission can be handled by the file system of the Android OS. In such a case, when a CRC error is encountered during file transfer, lower parts of the file system can properly handle the error. However, when iOS does not allow flash drive 400 to be recognized as a storage device, the file system of the iOS cannot be used to handle data transmission. As a result, when an error such as a CRC error is encountered during file transfer, and with the file system software not available, there may be no other software available to properly handle the error.

This problem can be solved by implementing a file system and including the file system with the data transfer application. When the iOS of ICD 510 doesn't allow flash drive 400 to be recognized as a storage device, the data transfer application can utilize its own file system to transfer data. Errors such as those that would be detected and addressed by the file system of the iOS (in some cases in conjunction with the iOS) can, instead, be detected and addressed by the file system of the data transfer application (in some cases in conjunction with the data transfer application). The data transfer application software, as well as the associated file system software, can be stored in flash memory 240. Flash drive 400 can read the data transfer and file system software from flash memory 240, send the software to ICD 510, and cause the software to be executed by ICD 510.

Without some form of protection, flash drive 400 could be damaged when both first connector 205 and second connector 210 are connected to computing devices. For example, the computing devices connected to the two connectors can attempt conflicting writes. This could result in corruption of the data in flash memory 240, or even physical damage to flash drive 400. To prevent this, in some embodiments flash drive 400 includes protection circuitry to detect when both interfaces are connected. This protection circuitry prevents any damage or malfunction that could result from both interfaces trying to simultaneously access the flash memory. Alternately, flash drive 400 can possess a physical mechanism that prevents both connectors from being connected to computing devices at the same time.

As a second example, a first power supply of a first computing device connected to first connector 205, and a second power supply of a second computing device connected to second connector 210, can interact, e.g., via a short circuit, and the interaction can damage a component coupled to either the first or the second power supplies. In some embodiments, flash drive 400 includes protection circuitry that prevents the first power supply and the second power supply from electrically interacting to damage any component coupled to either the first or the second power supplies, to prevent damage when each of the connectors of the flash drive are connected to a different computing device.

In some embodiments, when both first connector 205 and second connector 210 are connected to computing devices at the same time, storage controller 435 can further be configured to differentiate between a first USB host that is logically at NCD 505, and a second USB host that is logically at ICD 510. For example, storage controller 435 can differentiate between the hosts based on the value storage in latch 220, or can differentiate between the hosts based on data that is received from the computing device to which flash drive 400 is connected. The data that is received can be, for example, descriptors, and storage controller 435 can differentiate between the hosts based on the descriptors.

Further, flash drive 400 can determine with which of the two connected computing devices to communicate. For example, flash drive 400 can determine with which of the two connected computing devices to communicate based on the order that the two devices were connected to the respective compatible connectors of flash drive 400, based on the order that communication happens between flash drive 200 and each of the two computing devices, based on which of the two computing devices indicates that communicating with that particular computing device is higher priority, etc.

Figure 6:
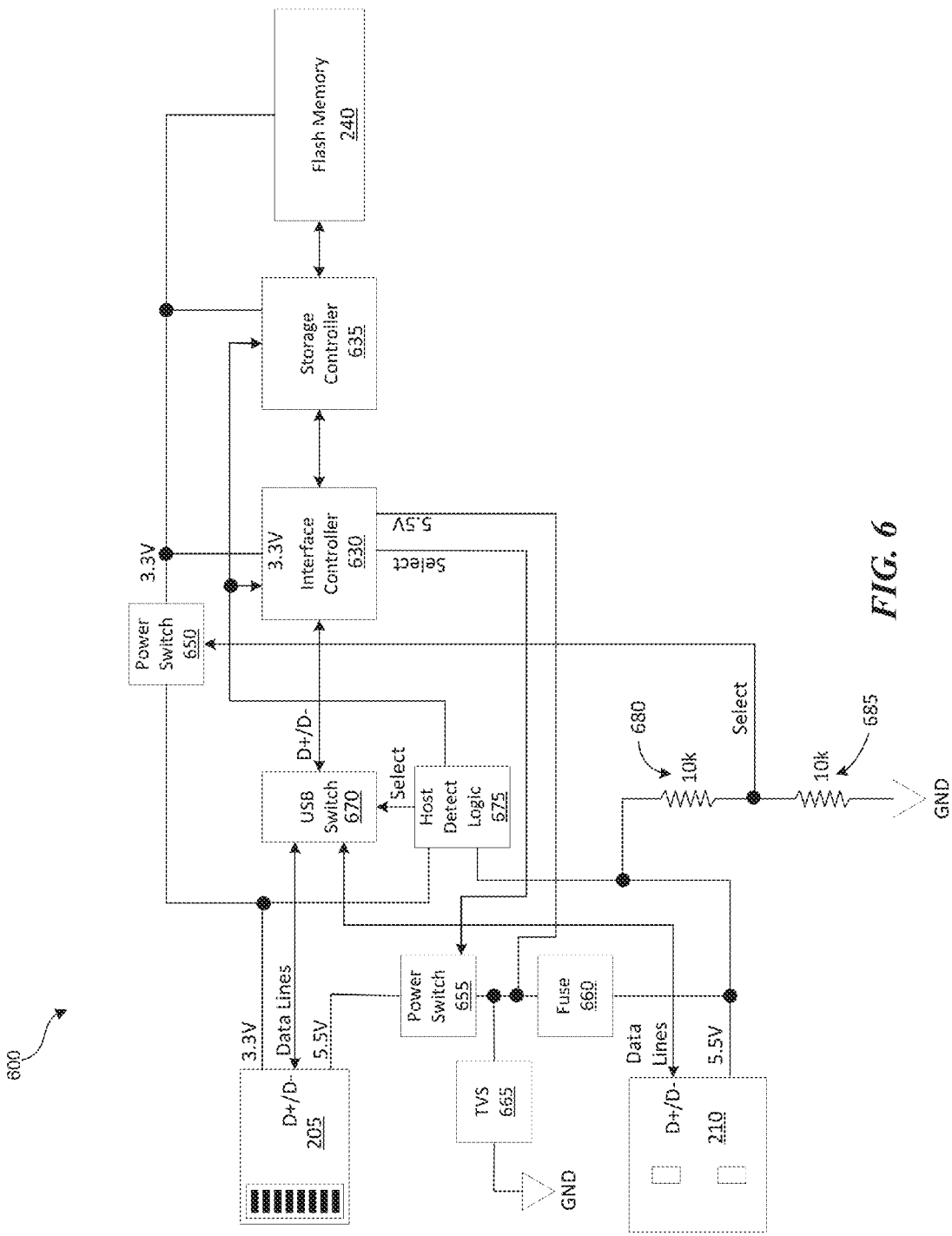
FIG. 6 is a block diagram illustrating an example of a flash drive with two controller modules that enables current to be passed from a source device to a mobile device, consistent with various embodiments.

FIG. 6 is a block diagram illustrating an example of a flash drive with two controller modules that enables current to be passed from a source device to a mobile device, consistent with various embodiments. Flash drive 600 includes first connector 205, second connector 210, flash memory 240, interface controller 630, storage controller 635, power switches 650 and 655, fuse 660, transient voltage suppressor (TVS) 665, USB switch 670, host detect logic 675, and resistors 680 and 685. Flash drive 600 can further include additional components. Interface controller 630 can be iOS interface controller 230 of FIG. 2, as well as other implementations. Storage controller 635 can be storage controller 235, as well as other implementations. USB switch 670 can be mux 215, as well as other implementations. Host detect logic 675, which can be a logic module, can be latch 220, as well as other implementations. In some embodiments, flash drive 600 includes security IC 225, which is coupled to interface controller 635.

Storage controller 635 is utilized for a first set of functionality that includes handling the USB protocol and managing communication with flash memory 240. In other embodiments, storage controller 635 handles other protocols for communicating with other devices, such as a Peripheral Protocol. Interface controller 630 is utilized for a second set of functionality that includes interfacing with an external computing device, such as an Apple iOS device, a computer running a version of the Windows operating system, a mobile device running a version of the Android™ operating system, etc. In some embodiments, interface controller 630 is further utilized to communicate with a security IC or module, such as Security IC 225.

In the embodiment of FIG. 6, first connector 205, second connector 210, flash memory 240, interface controller 630, storage controller 635, power switches 650 and 655, fuse 660, TVS 665, USB switch 670, host detect logic 675, and resistors 680 and 685 are each separate components that are connected to a PCB (not shown), and the PCB electrically connects the pins of the various components to enable the components to communicate with each other. In various embodiments, any of flash memory 240, interface controller 630, storage controller 635, power switches 650 and 655, fuse 660, TVS 665, USB switch 670, host detect logic 675, or resistors 680 and 685 can be integrated to create one or more components that integrate the functionality of these components, or can be sub-divided to create multiple components that, combined, include the functionality of one or more of these components. Further, these components can be connected to multiple PCBs, with the multiple PCBs coupled together via wires or by another mechanism that enables the components to communicate with each other.

Returning to the example of FIG. 1, flash drive 600 can be flash drive 110, lightning connector 130 can be first connector 205, and USB connector 125 can be second connector 210. Using the example of FIG. 1, user 105 can plug second connector 210 into a USB port of laptop 115. Once connected, a power pin of second connector 210 is electrically connected to the 5.5V power supply of laptop 115, and the power pin transmits the 5.5V to host detect logic 675.

At this point, no device is connected to first connector 205, and the power pins of first connector 205 are unconnected. Host detect logic 675 determines which device of devices that are connected to flash drive 600, via first connector 205 or second connector 210, is the host device to which flash drive 600 communicates. In some embodiments, the host device is a USB host, and flash drive 600 sends a message or signal to the host device to establish the host device as the USB host. Subsequent communications between the host device and flash drive 600 can be based on flash drive 600 being established as the USB host.

An output of host detect logic 675 controls USB switch 670, which is a data switch, to enable the host device to communicate with interface controller 630 by configuring USB switch 670 to allow data to pass between interface controller 630 and second connector 210. Another output of host detect logic 675, to identify which device is the host and whether there are one or two devices connected to flash drive 600, is coupled to interface controller 630 and storage controller 635.

Host detect logic 675 can use any of various algorithms/mechanisms to determine which device is the host when multiple devices are connected to flash drive 600. In some embodiments, host detect logic 675 determines which device is the host device based on which device was first connected to and powered up flash drive 600. In other embodiments, host detect logic 675 sets, when two devices are connected to flash drive 600, the host to the device connected to a prioritized connector. For example, when both first and second connectors 205 and 210 are connected to devices, host detect logic 675 can determine that the device connected to second connector 210 is the host, even when flash drive 600 was initially connected to a device via first connector 205, and the device was initially set as the host.

In the example of FIG. 6, host detect logic 675 determines the host based on a prioritization of the connectors, where a device connected to first connector 205 is determined to be the host when devices are connected to both first and second connectors 205 and 210. Host detect logic 675 detects that the 5.5V power pin from second connector 210 is active, and that the 3.3V power pin from first connector 205 is inactive, and determines that the device connected to second connector 210, which is laptop 115, is the host. Host detect logic 675 further determines that there is only one device connected to flash drive 600. The output of host detect logic 675 that controls USB switch 670 is set to a second value to indicate that the device connected to second connector 210 is the host. The output of host detect logic 675 is electrically connected to the select input of USB switch 670. A second output of host detect logic 675 is electrically connected to interface controller 630 and storage controller 635, and is set to a value that indicates both that the device connected to second connector 210 is the host, and that flash drive 600 is connected to one device.

When the select input to USB switch 670 is set to the second value, USB switch 670 enables the data pins of second connector 210 to be coupled to interface controller 630, such that data can be sent back and forth between laptop 115 and interface controller 630. The second output of host detect logic 675, which is connected to interface controller 630 and storage controller 635, can be sampled by interface controller 630 and storage controller 635 to determine that the device connected to second connector 210 is the host and that flash drive 600 is connected to one device.

The various components of flash drive 600 can be powered by the appropriate power supply pin. Prior to flash drive 600 being connected to any device, the voltage of the three nodes to which resistors 680 and 685 are connected are all the same, so the voltage of the node between the two resistors is the same as the voltage of the ground node to which resistor 685 is connected. As second connector 210 is connected to laptop 115, the 5.5V output of second connector 210 powers up and current flows through resistors 680 and 685 to ground resulting in the voltage of the node between the two resistors increasing relative to the ground node. The node between the two resistors is connected to power switch 650, and sets the switch to an appropriate state.

When the 5.5V power is available, the voltage of the node between the two resistors increases, disabling power switch 650 and preventing 3.3V power from flowing from first connector 205 to interface controller 630, storage controller 635, or flash memory 240. Interface controller 630 includes a power converter that generates 3.3V from the 5.5V power supply. When the 5.5V power is available, interface controller 630 supplies 3.3V power to storage controller 635 and flash memory 240. When the 5.5V power of second connector 210 is not available, the voltage of the node between the two resistors is at ground, thereby enabling power switch 650 and enabling 3.3V power to flow from first connector 205 to interface controller 630, storage controller 635, and flash memory 240.

Once flash drive 600 is powered up, the components go through a reset sequence, which initializes the components and begins the execution of an application program that is stored in flash memory 240 to effectively "boot" the flash drive into a ready state. Related to this "boot" process, an enumeration process is initiated where flash drive 600 and laptop 115 communicate to identify device type. In some embodiments, during the enumeration process, flash drive 600 and laptop 115 communicate to determine an allowable amount of power for flash drive 600 to draw from the USB port of laptop 115, and flash drive 600 limits its power draw accordingly. Limiting its power draw can also include flash drive 600 limiting the power draw of a second device that is connected to the flash drive, and that can draw power from flash drive 600.

At some point after flash drive 600 is in the ready state, laptop 115 sends a USB protocol message to flash drive 600 to initiate communication. The USB protocol message passes through USB switch 670 to interface controller 630, which relates the USB protocol message to storage controller 635. Storage controller 635 is configured, via customization of the IC design of storage controller 635, and/or via software that storage controller 635 executes, to communicate using the USB protocol. Storage controller 635 receives and recognizes the USB commands, and acts accordingly to establish a communication channel between laptop 115 and flash drive 600. User 105, using the Windows interface, initiates a copy command to copy some data, such as a movie, from laptop 115 to flash drive 600.

Laptop 115, utilizing a series of USB commands, sends the movie via second connector 210 and USB switch 670 to interface controller 630, which forwards the data to storage controller 635, which acts according to the USB commands and writes the movie to flash memory 240. Storage controller 635 is also configured, via customization of the IC design of storage controller 635, and/or via software that storage controller 635 executes, to manage communications with flash memory 240, similar to storage controller 235.

After the movie is copied to flash drive 600, user 105 plugs the flash drive into smartphone 120, so that flash drive 600 is connected to both laptop 115 and smartphone 120. Host detect logic 675 determines that both the 3.3V power of first connector 205 and the 5.5V power of second connector 210 are active. Based on smartphone 120 being connected to the prioritized connector, which is first connector 205, the output of host detect logic 675 is set to a first value to indicate that the device connected to first connector 205, which is smartphone 120, is the new host device. As discussed above, in some embodiments, the host device is a USB host. Flash drive 600 can send a message or signal to the new host device to establish the new host device as the USB host. Subsequent communications between the new host device and flash drive 600 can be based on flash drive 600 being established as the new USB host.

USB switch 670, based on the switch select being set to the first value, enables the data pins of first connector 205 to be coupled to interface controller 630, such that data can be sent back and forth between smartphone 120 and interface controller 630. The second output of host detect logic 675 that is connected to interface controller 630 and storage controller 635 is set to a value that indicates both that smartphone 120 is the host, and that flash drive 600 is connected to two devices.

Enumeration starts between flash drive 600 and smartphone 120 to determine the device type. After enumeration, a communication channel is established between smartphone 120 and flash drive 600. Interface controller 630 further determines, based on the value of the second output of host detect logic 675, that flash drive 600 is connected to two devices. Interface controller 630 controls the state of power switch 655 with a select signal that is electrically connected to power switch 655. By setting the select signal of power switch 655 to enable the power switch, interface controller 630 enables power to flow from laptop 115 through the 5.5V power signal of second connector 210 through fuse 660 through power switch 655 through first connector 205 to smartphone 120. Smartphone 120 can use this power in any of various ways, such as to power smartphone 120 or to charge a rechargeable battery of smartphone 120. Fuse 660 can be a resettable fuse. TVS 665 and fuse 660 are used to help prevent damage from power supply over/under voltage to the components of flash drive 600 and the devices that are connected to flash drive 600. If excessive current flows through fuse 660, the fuse trips and disables the power flow. Fuse 660 can be a resettable fuse. TVS 665 helps to protect against over/under voltage by clamping the voltage to within a certain range.

In some embodiments, during the enumeration process, flash drive 600 and smartphone 115 communicate to determine an allowable amount of power for smartphone 120 to draw from flash drive 600. Flash drive 600 can determine the power draw of smartphone 120 based on the amount of power that can be provided by the USB port of laptop 115 and based on the power consumption of the components of flash drive 600. For example, if laptop 115 can provide ten watts of power to flash drive 600, and the components of flash drive 600 consume one watt, then flash drive 600 should limit the power draw by smartphone 120 to nine watts or less. If smartphone 120 can be set to draw either five watts or ten watts, flash drive 600 can communicate with smartphone 120 to set the power draw of flash drive 600 to five watts (as setting the draw to ten watts would overload the power that can be provided by laptop 115).

In some embodiments, such as an embodiment where flash drive 600 includes a security IC such as Security IC 225, smartphone 120 can send a Peripheral Protocol message to flash drive 600 to initiate communication and authorize flash drive 600. The Peripheral Protocol message passes through USB switch 670 to interface controller 630. Interface controller 630 is configured, via customization of the IC design of interface controller 630, and/or via software that interface controller 630 executes, to communicate using the Peripheral Protocol. Interface controller 630 receives and recognizes the Peripheral Protocol commands. When smartphone 120 is Apple iOS device, flash drive 600 can be authorized by smartphone 120. Smartphone 120 sends a message to initiate the authorization process, in response to which interface controller 630 communicates with the security IC to obtain authentication data. The security IC sends the authentication data to interface controller 630, which forwards the authentication data to smartphone 120 to authorize the flash drive and enable data transfers between the flash drive and smartphone 120.

User 105 initiates a copy command to copy the movie from flash drive 600 to smartphone 120. Smartphone 120, utilizing a series of commands, which can include either USB commands, which are handled by storage controller 635, or Peripheral Protocol commands, which are handled by interface controller 630, or both USB and Peripheral Protocol commands, begins the copy process. Storage controller 635 reads the movie from flash memory 240 and sends the movie to interface controller 630, which forwards the movie via USB switch 670 and first connector 205, to smartphone 120.

Figure 7:
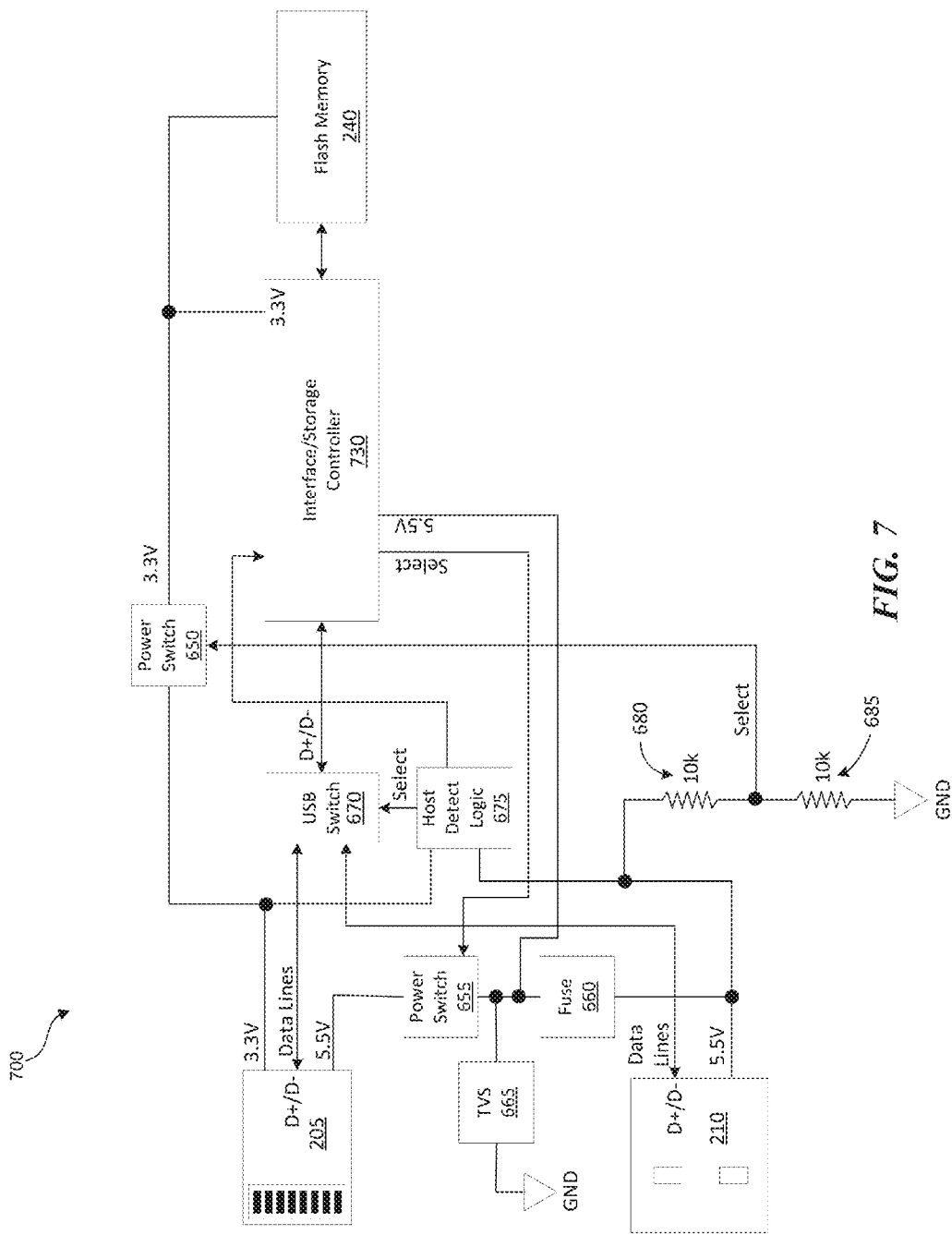
FIG. 7 is a block diagram illustrating an example of a flash drive with an integrated controller module that enables current to be passed from a source device to a mobile device, consistent with various embodiments.

FIG. 7 is a block diagram illustrating an example of a flash drive with an integrated controller module that enables current to be passed from a source device to a mobile device, consistent with various embodiments. In the example of FIG. 7, flash drive 700 is the same as flash drive 600, except that the functionality of interface controller 630 and storage controller 635 have been integrated into interface/storage controller 730, which can be an IC. Further, flash drive 700 can be the same as flash drive 300, and can be a different implementation. Interface/storage controller 730 can be the same as storage controller 335, and can be a different implementation.

Figure 8:
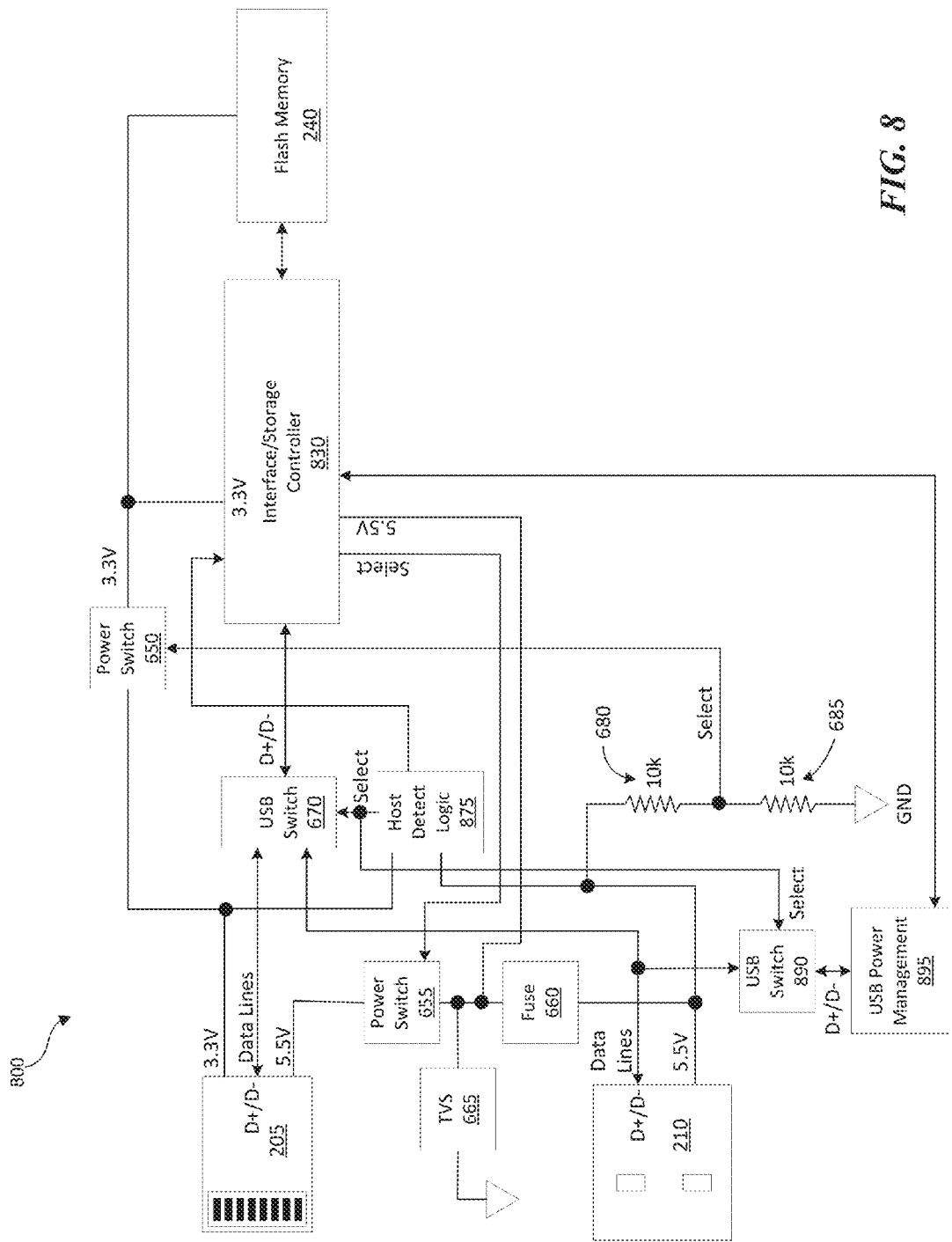
FIG. 8 is a block diagram illustrating an example of a flash drive with a power management module that enables current to be passed from a source device to a mobile device, consistent with various embodiments.

FIG. 8 is a block diagram illustrating an example of a flash drive with a power management module that enables current to be passed from a source device to a mobile device, consistent with various embodiments. In the example of FIG. 8, flash drive 800 can be the same as flash drive 300, as well as flash drive 700, and can be a different implementation. Interface/storage controller 830 can be the same as interface/storage controller 730, as well as storage controller 335, and can be a different implementation. Host detect logic 875, which can be a logic module, can be the same as host detect logic 675, and can be a different implementation. Flash drive 800 includes several components/modules that are not included in the illustration of FIG. 7, including interface/storage controller 830, host detect logic 875, USB switch 890, and USB power management 895. Flash drive 800 can further include additional components. In some embodiments, flash drive 800 includes security IC 225, which is coupled to interface/storage controller 830, and can communicate using Peripheral Protocol commands.

In the embodiment of FIG. 8, first connector 205, second connector 210, flash memory 240, interface/storage controller 830, power switches 650 and 655, fuse 660, TVS 665, USB switches 670 and 890, host detect logic 875, USB power management 895, and resistors 680 and 685 are each separate components that are connected to a PCB (not shown), and the PCB electrically connects the pins of the various components to enable the components to communicate with each other. In various embodiments, any of flash memory 240, interface/storage controller 830, power switches 650 and 655, fuse 660, TVS 665, USB switches 670 and 890, host detect logic 875, USB power management 895, and resistors 680 and 685 can be integrated to create one or more components that integrate the functionality of these components, or can be sub-divided to create multiple components that, combined, include the functionality of one or more of these components. Further, these components can be connected to multiple PCBs, with the multiple PCBs coupled together via wires or by another mechanism that enables the components to communicate with each other.

Flash drive 800 functions similar to flash drive 700. Flash drive 800 includes USB power management 895, which does not appear in the illustration of FIG. 7, and which is a power management module/component. Returning once again to the example of FIG. 1, flash drive 800 can be flash drive 110, lightning connector 130 can be first connector 205, and USB connector 125 can be second connector 210. Using the example of FIG. 1, user 105 can plug second connector 210 into the USB port of laptop 115. Once connected, a power pin of second connector 210 is electrically connected to the 5.5V power supply of laptop 115, and the power pin transmits the 5.5V to host detect logic 875.

At this point, no device is connected to first connector 205, and the power pins of first connector 205 are unconnected. Host detect logic 875 determines which device of devices that are connected to flash drive 800, via first connector 205 or second connector 210, is the host device to which flash drive 800 communicates. In some embodiments, the host device is a USB host, and flash drive 800 sends a message or signal to the host device to establish the host device as the USB host. Subsequent communications between the host device and flash drive 800 can be based on flash drive 800 being established as the USB host.

An output of host detect logic 875 controls USB switch 670 and USB switch 890 to enable the host device to communicate with USB power management 895 during enumeration, and to enable the host device to communicate with interface/storage controller 830 at other times. A second output, to identify which device is the host and whether there are one or two devices connected to flash drive 800, is coupled to storage/interface controller 830. Host detect logic 875 can use any of the various algorithms/mechanisms described above related to host detect logic 675 to determine which device is the host.

In the example of FIG. 8, host detect logic 875 determines the host based on a prioritization of the connectors, where a device connected to first connector 205 is determined to be the host when devices are connected to both first and second connectors 205 and 210. Host detect logic 875 detects that the 5.5V power pin from second connector 210 is active, and that the 3.3V power pin from first connector 205 is inactive. Based on this, host detect logic 875 determines that the device connected to second connector 210, which is laptop 115, is the host, and that there is only one device connected to flash drive 800.

As flash drive 800 powers up, the components go through a reset sequence, which initializes the components and begins the execution of an application program that is stored in flash memory 240 to effectively "boot" the flash drive into a ready state. Related to this "boot" process, an enumeration process is initiated where flash drive 800 and laptop 115 communicate to identify device type. During the enumeration process, flash drive 800 and laptop 115 communicate to determine an allowable amount of power for flash drive 800 to draw from the USB port of laptop 115. This power-related communication is handled by USB power management 895.

During these power-related communications, the output of host detect logic 875 that controls USB switches 670 and 890 is set to a value that enables the host to communicate with USB power management 895. USB power management 895 communicates with the host to determine an allowable amount of power that flash drive 800 can pull from the USB connector of the host. Flash drive 800 then limits its power draw accordingly. Limiting its power draw can include flash drive 800 limiting the power draw of a second device that is also connected to the flash drive. For example, flash drive 800 can determine that laptop 115 can provide ten watts, and can determine that smartphone 120 can draw either five watts or ten watts. Further, flash drive 800 consumer one watt of power. If flash drive 800 enables smartphone 120 to draw ten watts, then the power being drawn from the USB port of laptop 115 will be eleven watts, which exceeds the ten watt limit. So flash drive 800 communicates with smartphone 120 to limit the power consumption of smartphone 120 to five watts.

After USB power management 895 has completed its communications with the host device, then the output of host detect logic 875 that controls USB switches 670 and 890 is set to enable the host to communicate with interface/storage controller 830. From this point on, flash drive 800 functions similar to flash drive 700 until a new device is connected to flash drive 800. Once a new device is connected and an enumeration process starts with the newly connected device, host detect logic 875 once again sets its output to enable USB power management 895 to connect to the newly connected device during enumeration. Once these communications are completed, host detect logic 875 once again sets its output to enable the host, which may have changed e.g. from laptop 115 to smartphone 120, to communicate with interface/storage controller 830. From this point on, flash drive 800 once again functions similar to flash drive 700, until yet another new device is connected to flash drive 700, and another enumeration process begins.

Figure 9:
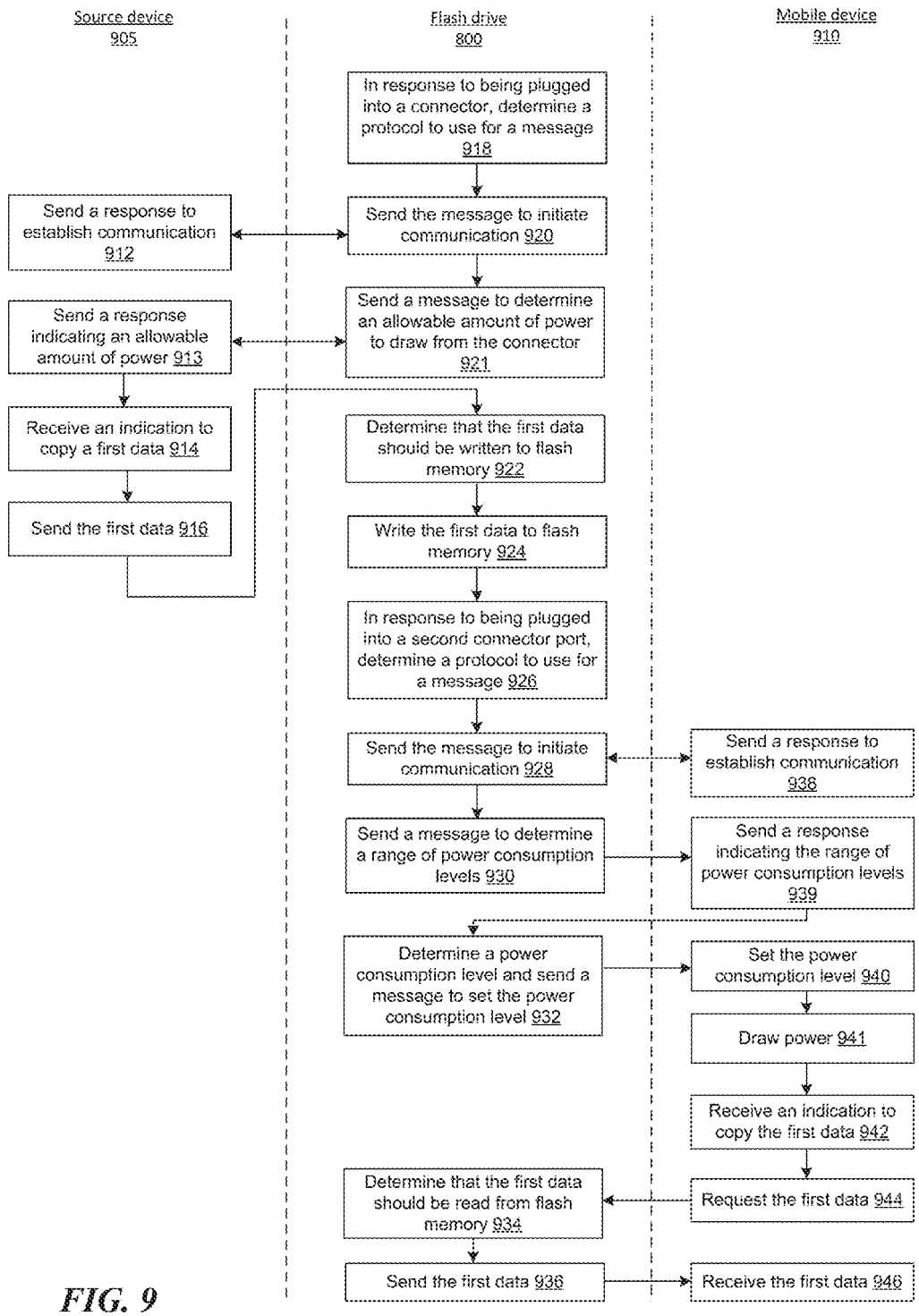
FIG. 9 is an activity diagram illustrating the use of a flash drive to pass current from a source device to a mobile device, consistent with various embodiments.

FIG. 9 is an activity diagram illustrating the use of a flash drive to pass current from a source device to a mobile device, consistent with various embodiments. Source device 905 is a computing device with a first connector, such as laptop 115 where the first connector is a USB port, and mobile device 910 is a computing device with a second connector, such as smartphone 120 where the second connector is a Lightning port. While this diagram illustrates using flash drive 800 to copy data from source device 905 to mobile device 910, data can similarly be copied from mobile device 910 to source device 905 using flash drive 800.

Source device 905 can be any type of computing device that includes a connector, such as a USB port, that can provide power. Source device 905 can also be a power adapter, which is not a computing device, but rather is a device whose primary purpose is to provide power. However, when source device 905 is a power adapter and is not a computing device, steps 914, 916, 922, and 924 are not possible, and, in some embodiments, step 913 is not possible either. Mobile device 910, as well as any other mobile device discussed herein, can be any type of mobile device, such as a laptop computer, a tablet computer, a cell phone, a smart phone, a wearable device, etc.

A user, such as user 105, plugs a connector of flash drive 800, such as a male USB connector, into a compatible connector of source device 905, such as a female USB connector. After being plugged in, flash drive 800 powers up and goes through a reset sequence where it initializes to a ready state. In some embodiments, during the initialization process flash drive 800 reads and executes software from flash memory 240. For example, after going through the reset sequence, interface/storage controller 830 reads data from flash memory 240. The data can be software to be executed interface/storage controller 830. The software can be executed to put flash drive 800 into a ready state.

Once flash drive 800 is in the ready state, either flash drive 800 or source device 905 can initiate communication between the two devices. In response to being plugged into the USB connector of source device 905 and effectively "booting" to the ready state, flash drive 800 can determine a protocol to use to send a message to source device 905 to initiate communication between the devices (step 918). For example, flash drive 800 can determine, based on being plugged into a USB connector, to send a USB command or message to source device 905 to initiate communication (step 920). In response to receiving the USB command or message, source device 905 can send a response to establish communication between the devices (step 912). In some embodiments or cases, source device 905 can send the message to initiate communication to flash drive 800, and flash drive 800 can send a response to establish communication.

Some peripheral interface standards, such as USB (per, for example, the USB power delivery specification), allow connector ports to provide a range of power levels, and also allow connector ports to draw a range of power levels. For example, a USB port of a first device may allow only 100 milliamps (ma) to be drawn by a connected device, while a USB port of a second device may allow 500 ma to be drawn by a connected device. In some cases the power to be drawn can be negotiated. For example, while the USB port of the first device only allows 100 ma to be drawn initially, it may be possible to negotiate with the first device to have the first device increase the current that the USB port can provide. Similarly, a USB port of a first device may draw 100 ma by default, and may be able to increase its current draw.

For example, a USB port of a first device that can source power is connected to a micro-USB port of a second device that needs to recharge its battery. The two devices can exchange power information, such as during enumeration. The USB port of the first device may initially be set to provide 100 ma. During enumeration, the second device may determine that the USB port of the first device can be set to provide more power, and may request that the first device provide more power, for example, raising the current to be provided from 100 ma to 500 ma. Similarly, the USB port of the second device initially be set to draw 100 ma. Based on determining that the source USB port can provide 500 ma, the second device may raise the current consumption of its micro-USB port from 100 ma to 500 ma.

Even if flash drive 800 consumes an amount of power that is so small that it will not exceed any power limit of any USB port, because flash drive 800 can pass current from one connected device to a second connected device, flash drive 800 needs to know how much power the connector port of source device 905 can provide. Flash drive 800 needs to know this so that it can ensure that the combined power draw of flash drive 800, and of a second device that may be connected to flash drive 800 at some point in the future, will not exceed the power supply capability of source device 905. So flash drive 800 sends a message to source device 905 to determine an allowable amount of power that can be drawn from the USB connector (step 921). Source device 905 sends a response that indicates an allowable amount of power (step 913). For example, source device 905 may send a response that indicates that it can provide only one power level. In some embodiments, source device 905 may send a response that indicates that the USB connector port can be set to provide multiple difference power levels. In these embodiments, flash drive 800 can communicate with source device 905 to cause source device 905 to set the power level of the USB connector port to a desired level.

At some point in time, user 105 indicates that he wants to copy data, such as a movie, from source device 905 to flash drive 800. For example, user 105 can utilize a user interface of a source device, such as windows explorer of laptop 115, to indicate to copy the movie to flash drive 800 (step 914). Source device 905 can send the movie to flash drive 800 using the USB protocol and USB protocol commands (step 916). Flash drive 800 receives the commands at interface/storage controller 830, where the USB commands are interpreted. Based on the received USB commands, interface/storage controller 830 determines to write the movie data to flash memory 240 (step 922), and manages the writing of the data to flash memory 240 (step 924).

At a later point in time, user 105 plugs a connector of flash drive 800, such as a male Lightning connector, into a compatible connector of mobile device 910, such as a female Lightning connector. After being plugged in, host detect logic 875 of flash drive 800 determines that flash drive 800 is connected to two devices, and determines to change the host from source device 905 to mobile device 910. Flash drive 800 sends a message to mobile device 910 to initiate communication (step 928). Mobile device 910 responds to establish communication with flash drive 800 (step 938).

As discussed above, flash drive 800 needs to ensure that its current draw from the USB port of source device 905 does not exceed an allowable level. Flash drive 800 sends a message to determine a range of power consumption levels to mobile device 910 (step 930). Mobile device 910 sends a response indicating the range of power consumption levels (step 939). In some cases, the range may be a single value. In other cases, the range may be multiple discreet levels. Flash drive 800 earlier determined an allowable amount of power that can be drawn from the USB port of source device 905. Flash drive 800 also knows how much power it consumes. Based on this, and based on the indicated range of power consumption levels of mobile device 910, flash drive 800 determines a power consumption level for mobile device 910 (step 932). Flash drive 800 sends a message to mobile device 910 to set the power consumption level that mobile device 910 will draw from flash drive 800 via the connector (step 932). Mobile device 910 sends a message to cause the power consumption level smartphone 120 to be set to an appropriate level (step 940). Flash drive 800 enables power to flow from source device 905 to mobile device 910, such as by controlling power switch 655 to enable power to flow between the two devices. Mobile device 910 draws power that is less than or equal to the defined power consumption level (step 941).

At a later point in time, user 105 indicates that he wants to copy or stream the movie from flash drive 800 to mobile device 910. For example, user 105 utilizes a user interface of an OS that is running on mobile device 910 to indicate to copy or stream the movie from flash drive 800 to mobile device 910 (step 942). In response to the indication to copy or stream the movie, mobile device 910 sends a request for the movie to flash drive 800 (step 944). For example, mobile device 910 sends a USB command requesting the movie data to flash drive 800, where the command is directed to interface/storage controller 830, where the USB command is interpreted. Based on the received USB command, interface/storage controller 830 determines to read the movie data from flash memory 240 (step 934). Interface/storage controller 830 further manages the reading of the movie data from flash memory 240. After reading the movie data from flash memory 240, interface/storage controller 830 sends or streams the data to mobile device 910 (step 936), where the data is received (step 946).

During observations of people using smart phones and other mobile devices, observers noted that, when holding their smart phones vertically in their hand, people often held their phones between the base of their fingertips and the inner side of the hand. When holding a smart phone in this way, it was further noticed that many smart phone users would move their pinky finger to the bottom of the phone to stabilize it. When a user holds a smart phone in this way, and slides his pinky finger to the bottom of the phone to stabilize the phone, it was noticed that an empty space is created between the back of the phone and the palm of the user's hand.

Figure 10:
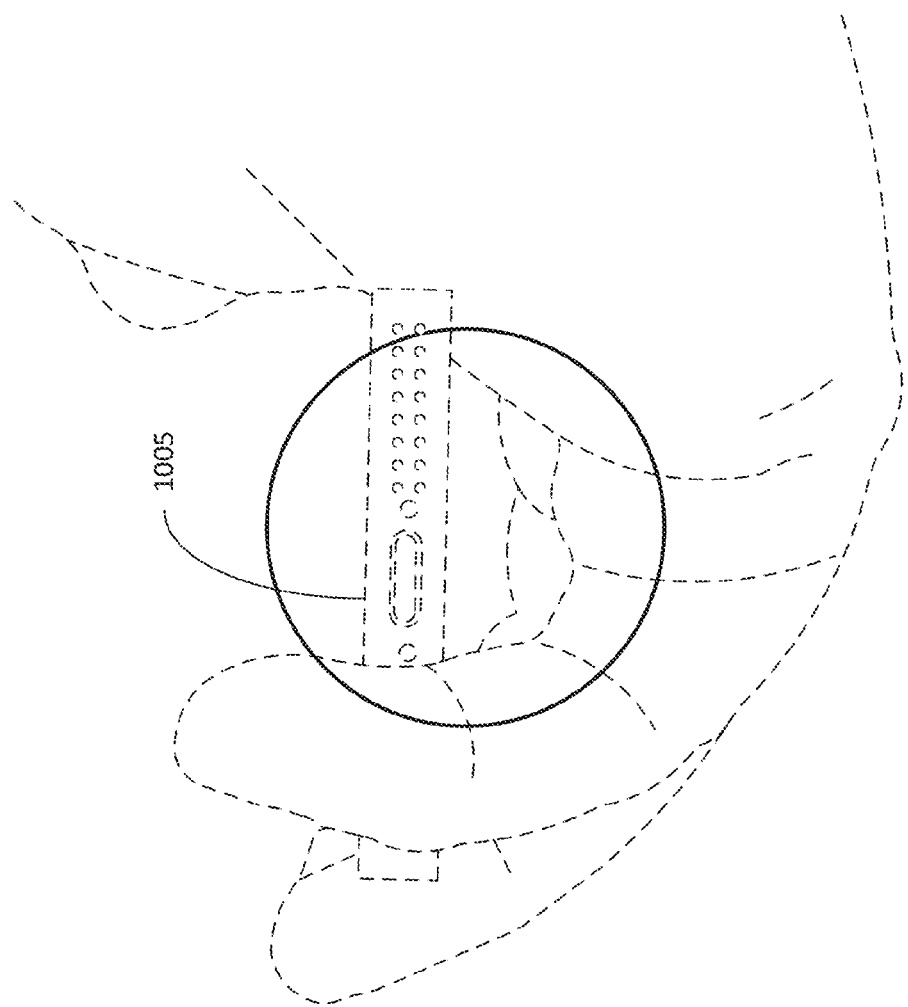
FIG. 10 is a diagram illustrating a space that is formed between a smart phone and a user's hand when the user holds the smart phone, consistent with various embodiments.
Figure 11:
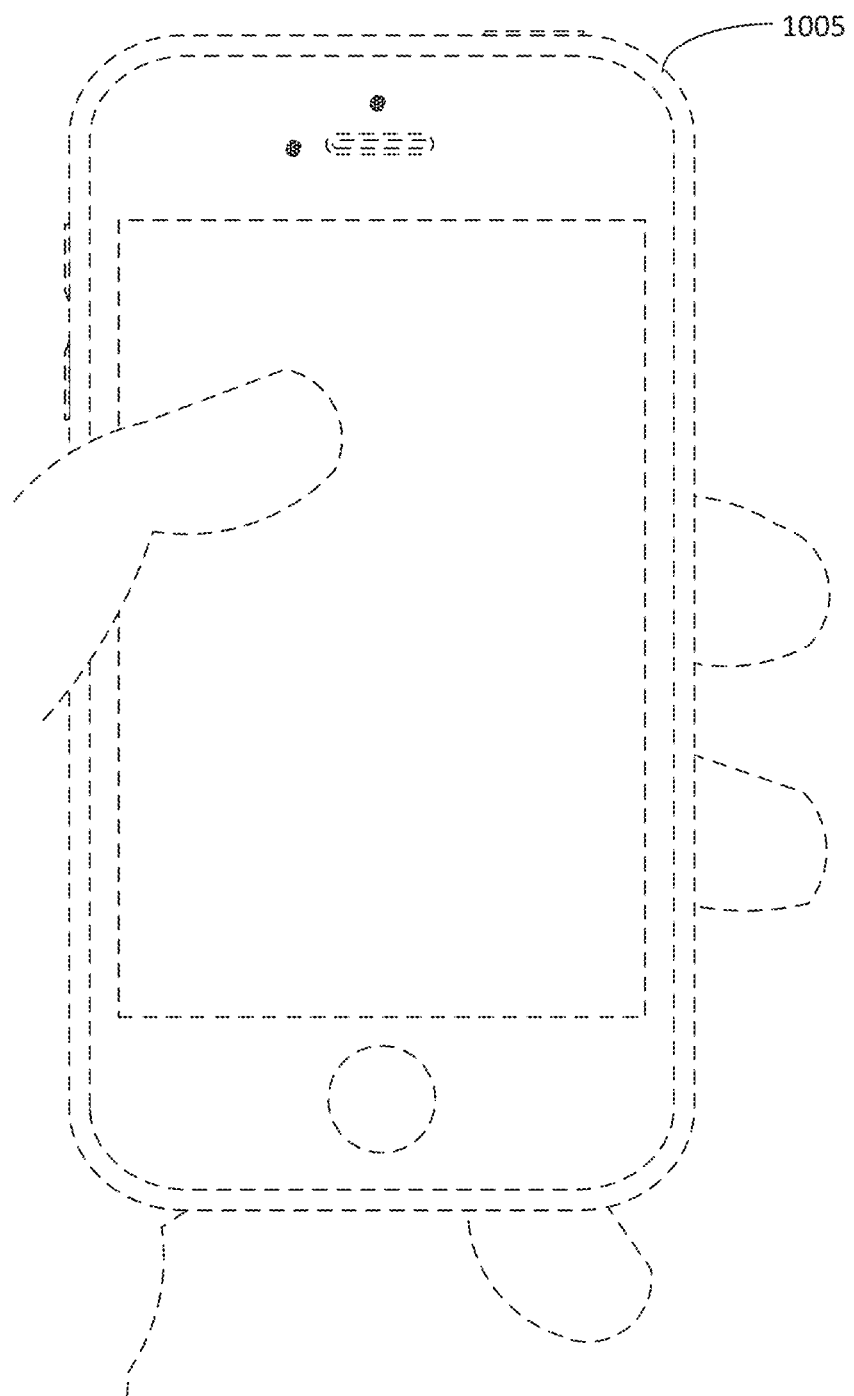
FIG. 11 is a diagram illustrating a user's pinky finger being placed on the bottom edge of a smart phone to stabilize the smart phone, consistent with various embodiments.

FIG. 10 is a diagram illustrating a space that is formed between smart phone 1005 and a user's hand when the user holds smart phone 1005, consistent with various embodiments. Smart phone 1005 is an Apple iPhone that has a Lightning connector port on the bottom edge of the phone. Observers, while developing the technology, observed people using their smart phones and other mobile devices. The observers noticed that, when holding their mobile devices vertically in their hand, people often hold their phones between the base of their fingertips and the inner side of the hand. FIGS. 10 and 11 illustrate, respectively, a bottom-view and a front-view of a user holding smart phone 1005 between the base of his fingertips and the inner side of his hand.

The observers further noticed that, when holding a smart phone in this way, many people place their pinky finger at the bottom of the phone to stabilize the phone. FIGS. 10 and 11, respectively, illustrate a bottom-view and a front-view of a user with his pinky placed at the bottom of smart phone 1005 to stabilize the phone. When a user holds a smart phone as depicted in FIGS. 10 and 11, the observers noticed that an empty space is created between the back of the phone and the palm of the user's hand. FIG. 10 illustrates such an empty space formed between the back of smart phone 1005 and the user's hand.

Figure 12:
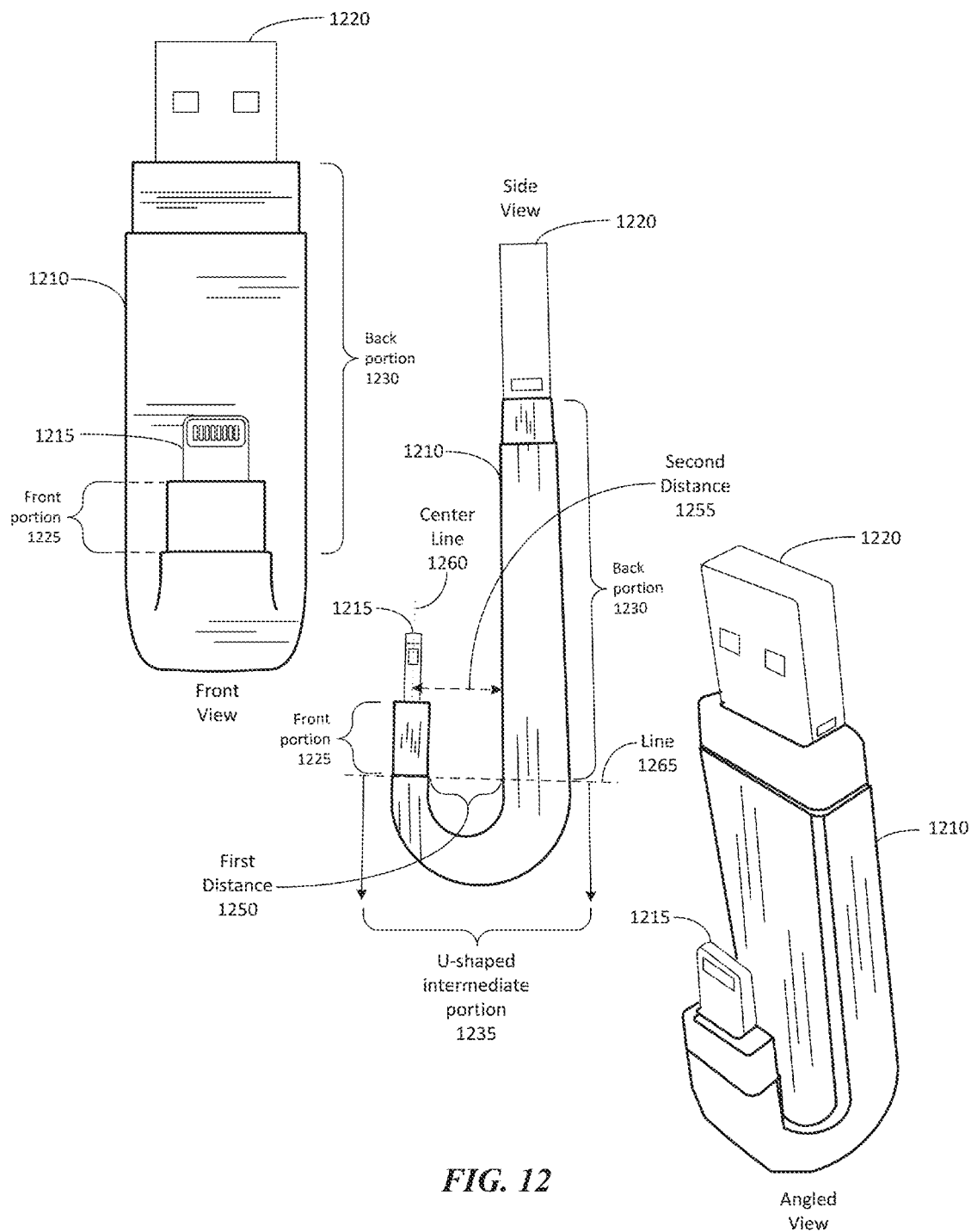
FIG. 12 is a diagram illustrating a flash drive that is shaped to utilize the space behind a mobile device, consistent with various embodiments, and as viewed from three different angles.

FIG. 12 is a diagram illustrating a flash drive that is shaped to utilize the space behind a mobile device, consistent with various embodiments, and as viewed from three different angles. In the embodiment of FIG. 12, flash drive 1210 has a J-shape, and has connectors on both ends of the J-shape. Mobile connector 1215, which is an Apple Lightning connector in the embodiment of FIG. 12, extends from front portion 1225, which is the short end of the J-shape. Connector 1220, which is a full size Universal Serial Bus (USB) connector in the embodiment of FIG. 12, extends from back portion 1230, which is the long end of the J-shape.

Figure 13:
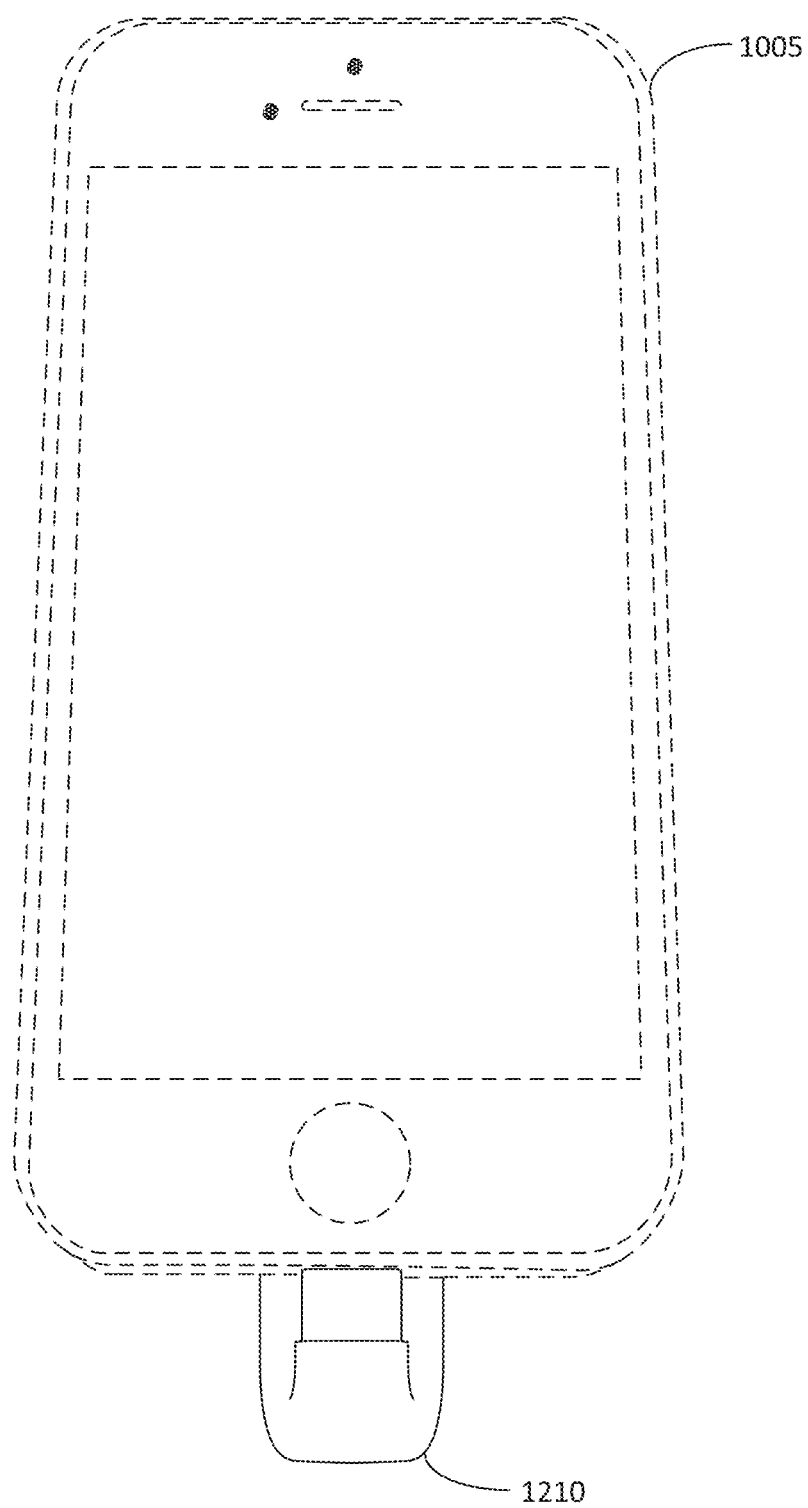
FIG. 13 is a diagram illustrating a front-view of a flash drive that is connected to a smart phone and is utilizing the space behind the smart phone, consistent with various embodiments.
Figure 14:
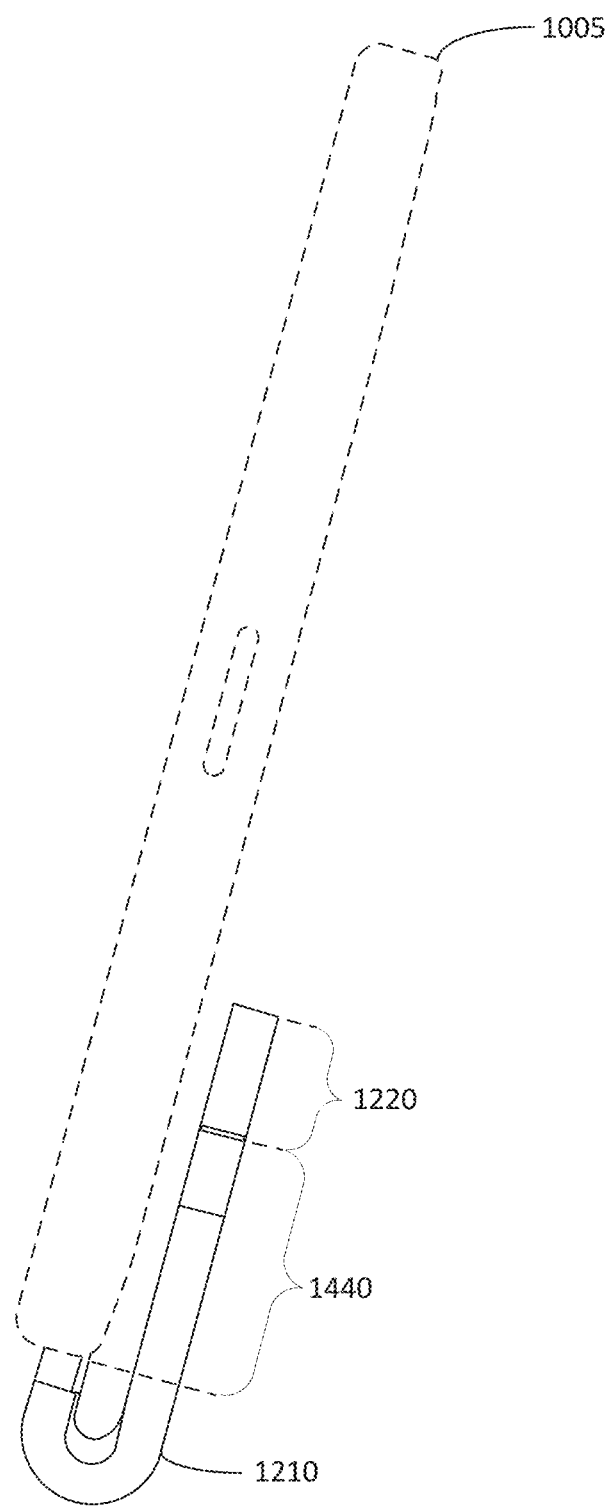
FIG. 14 is a diagram illustrating a side-view of a flash drive that is connected to a smart phone and is utilizing the space behind the smart phone, consistent with various embodiments.
Figure 15:
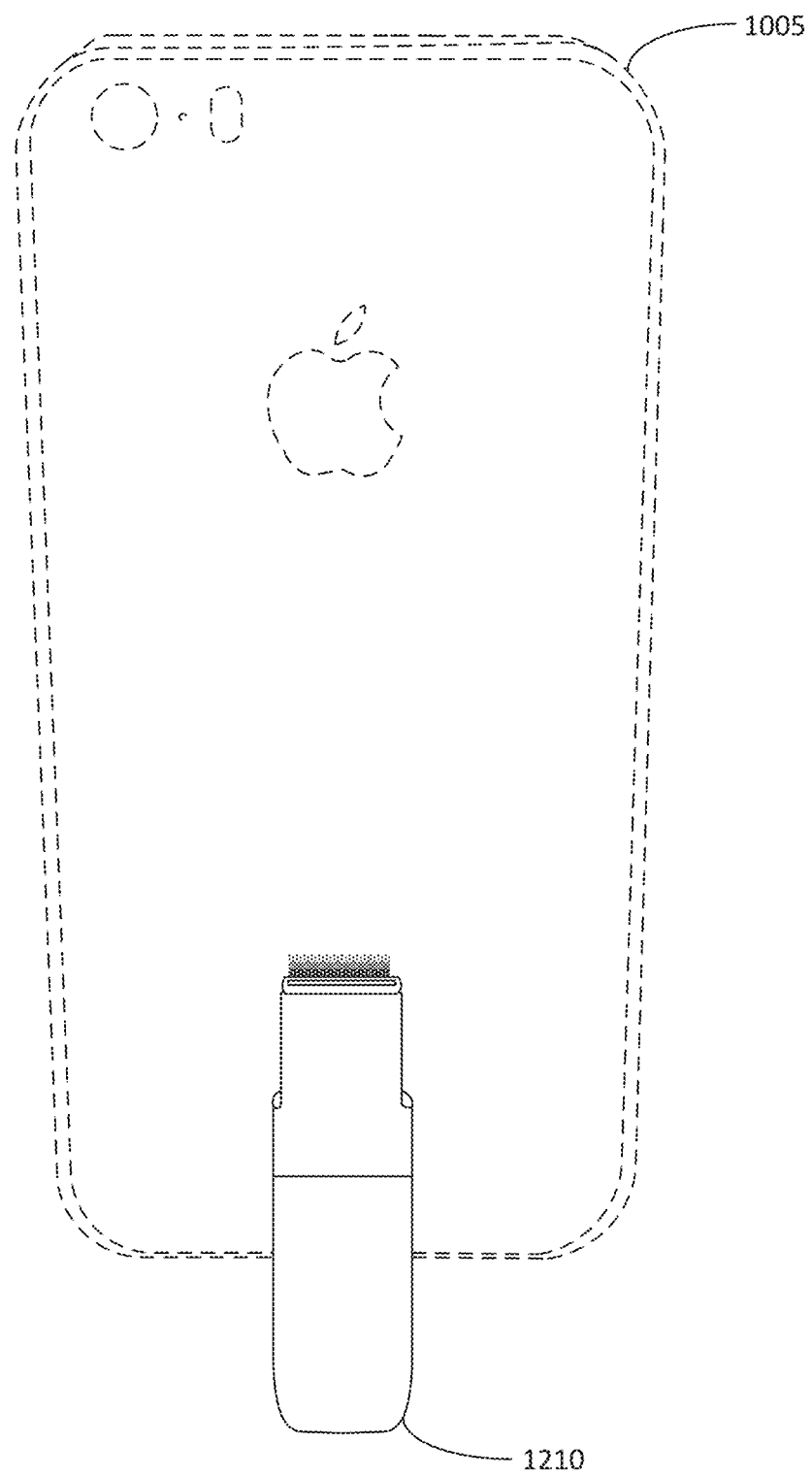
FIG. 15 is a diagram illustrating a back-view of a flash drive that is connected to a smart phone and is utilizing the space behind the smart phone, consistent with various embodiments.

When mobile connector 1215 is connected to a mobile device, such as smart phone 1005, the flash drive wraps around the mobile device and is located behind the mobile device, as is depicted in FIGS. 13-15. FIGS. 13-15 are diagrams illustrating, respectively, a front-view, a side-view, and a back-view, of flash drive 1210 connected to smart phone 1005, and utilizing the space behind the smart phone, consistent with various embodiments. While the flash drive of the embodiment of FIG. 12 is a particular shape, other embodiments can include any flash drive shaped or configured to enable the flash drive to wrap around a mobile device when connected to the mobile device, such that a portion of the flash drive is located behind the mobile device when so connected.

Figure 16:
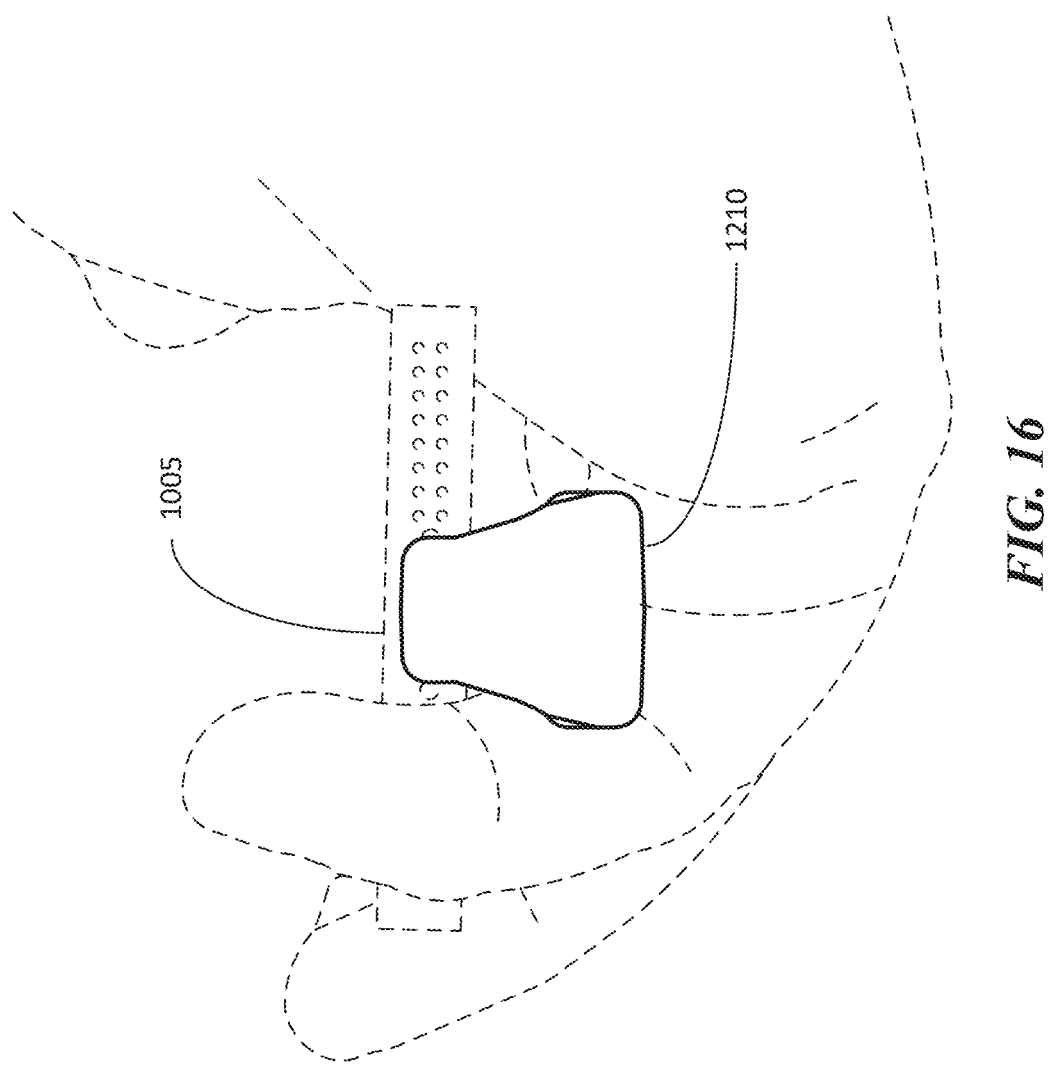
FIG. 16 is a diagram illustrating a bottom-view of a flash drive utilizing the space between a smart phone and a user's hand, consistent with various embodiments.
Figure 17:
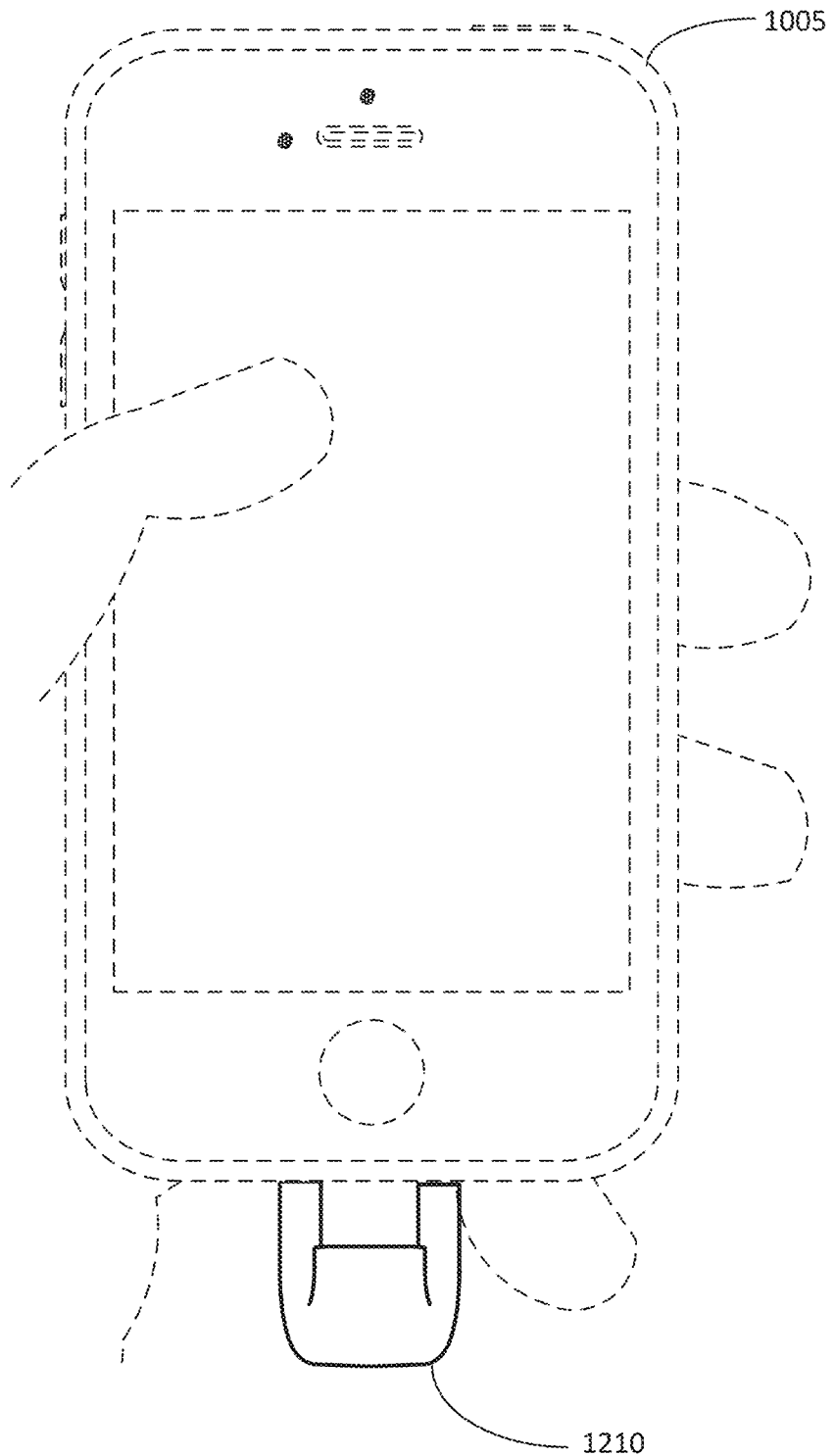
FIG. 17 is a diagram illustrating a front-view of a flash drive utilizing the space between the smart phone and the user's hand, consistent with various embodiments.

The portion of the flash drive that is located behind the mobile device can be adjacent to the back surface of the mobile device, as is depicted in FIGS. 14 and 15. When a user holds smart phone 1005, and flash drive 1210 is connected to the smart phone as depicted in FIGS. 13-15, connector 1220 and a part of back portion 1230 of flash drive 1210 can fit in the empty space between the user's hand and the back of smart phone 1210, as is depicted in FIGS. 16 and 17. FIGS. 16 and 17 are diagrams illustrating, respectively, a bottom-view and a front-view of flash drive 1210 utilizing the space between smart phone 1005 and a user's hand, consistent with various embodiments.

Further, when a mobile device is placed in a protective case such that a surface of the case covers the back surface of the mobile device, the portion of the flash drive that is located behind the mobile device (and behind the surface of the case) can be adjacent to the back surface of the mobile device. This is because a first object that is placed adjacent to a second object that is placed adjacent to a third object is, as used herein, adjacent to the third object. Therefore, a portion of a flash drive that is adjacent to a surface of a case that is adjacent to a back surface of a mobile device is, by definition herein, adjacent to the back surface of the mobile device.

In some embodiments, the body of the flash drive has three portions, a front portion, an intermediate portion, and a back portion. The front portion extends from the intermediate portion in a first direction, and has a mobile device connector extending from the end of the front portion. For example, the intermediate portion of flash drive 1210 can be U-shaped intermediate portion 1235, and the front portion can be front portion 1225. In various embodiments, the intermediate portion can be a rectilinear U-shape, a J-shape, or a V-shape, among others. A rectilinear U-shape is a U-shape that is formed of three rectangular pieces. The mobile device connector can be mobile connector 1215. The mobile device connector enables the flash drive to connect to and communicate with a mobile device. Examples of mobile devices include a smart phone, a tablet computer, a portable music device, etc.

The back portion of the body extends from the intermediate portion in a second direction, and has a device connector extending from the end of the back portion. The back portion of flash drive 1210 can be back portion 1230, and the device connector can be connector 1220. In some embodiments, the back portion of the body of the flash drive extends further from the intermediate portion in the first direction than the front portion extends from the intermediate portion in the second direction. In other embodiments, the back portion of the body of the flash drive extends further from the intermediate portion in the first direction than the front portion extends from the intermediate portion in the first direction. In yet other embodiments, the back portion of the body of the flash drive extends further from the intermediate portion in the first direction than the front portion extends from the intermediate portion in the first direction by more than a factor of two.

The first direction and the second direction can be substantially parallel, or the two directions can have an angle between them of up to 45 degrees. The preferred angle between the two directions is between zero degrees and approximately 20 degrees. When the angle between the two directions exceeds approximately 20 degrees, flash drives with longer back portions begin to have trouble fitting in the empty space, the empty space as depicted in FIG. 10, between the smart phone and the hand of a user holding the smart phone. As the angle between the two directions increases, the back portion needs to decrease in length in order to fit in this empty space. At angles above approximately 45 degrees, the flash drive is no longer able to reasonably utilize this empty space.

In some embodiments, the intermediate portion of the body is configured or shaped to cause, when the mobile connector is connected to a mobile device in a first orientation, a portion of the back portion of the mobile device, as well as the device connector, to be located behind the mobile device. FIG. 14 contains an example of a flash drive, flash drive 1210, with a portion of the back portion of the flash drive, portion 1440, as well as a device connector, connector 1220, located behind, and also adjacent to, the mobile device. FIG. 15 also contains an example of flash drive 1210 with a portion of the back portion of the flash drive, as well as a device connector, located behind, and also adjacent to, the mobile device. In some embodiments, the mobile connector of the flash drive can be inserted into the mobile connector port of the mobile device with a second orientation. For example, a Lightning connector can be inserted into a Lightning connector port in a first orientation, and also in a second orientation where the Lightning connector is rotated by 180 degrees. In such a case, when the flash drive is connected to the mobile device in the second orientation, the back portion of the mobile device, as well as the device connector, can be located in front of the mobile device and adjacent to a front surface of the mobile device.

Figure 18:
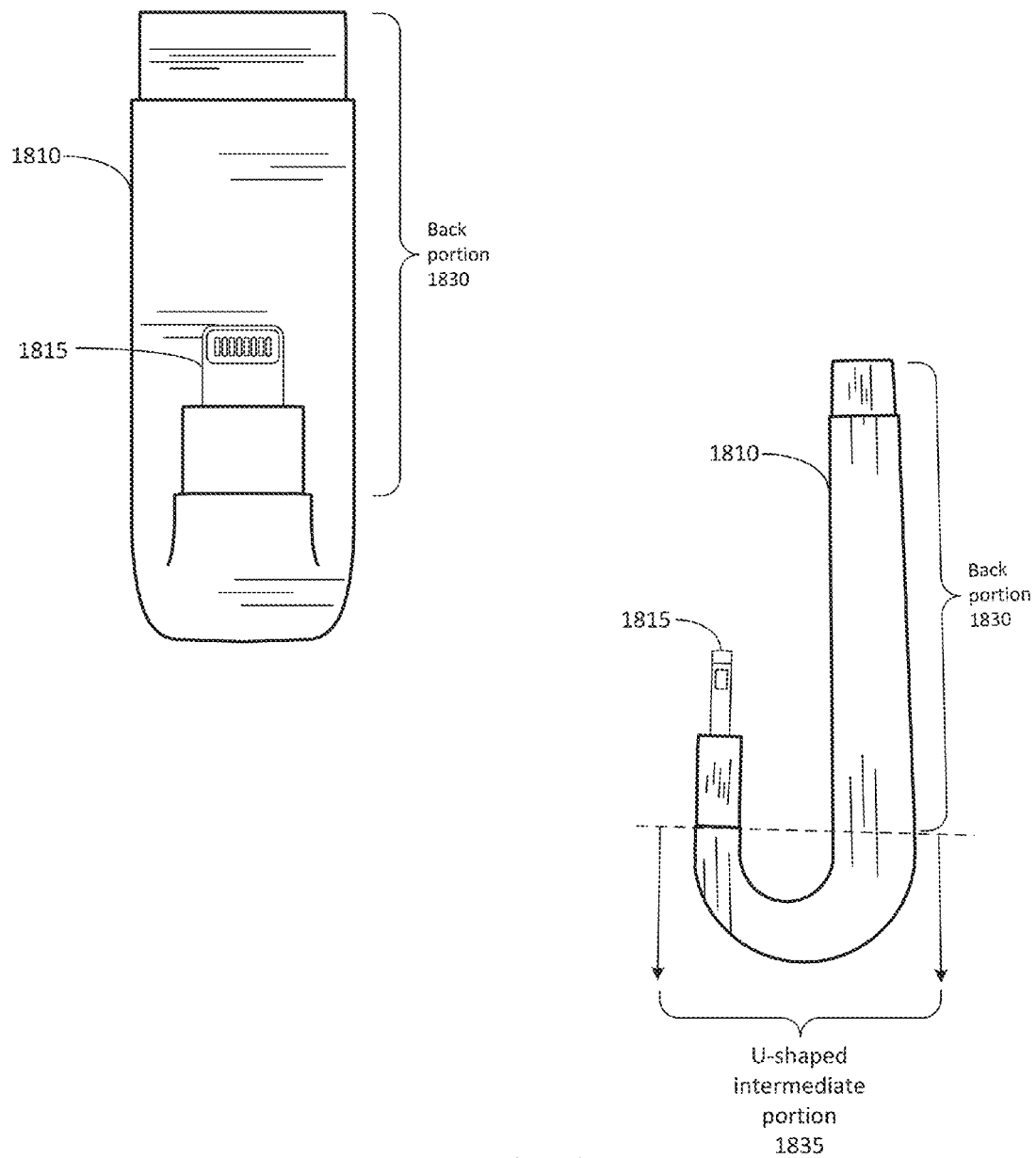
FIG. 18 is a diagram illustrating a flash drive with one connector that is shaped to utilize the space behind a mobile device, consistent with various embodiments, and as viewed from two different angles.

In some embodiments, such as the embodiment of FIG. 18, the flash drive has only one connector, a mobile connector. FIG. 18 is a diagram illustrating a flash drive with one connector that is shaped to utilize the space behind a mobile device, consistent with various embodiments, and as viewed from two different angles. The flash drive of FIG. 18, flash drive 1810, has one connector, connector 1815. In embodiments where the flash drive has only one connector, the back portion of the flash drive, such as back portion 1830, does not have a connector. In some of these embodiments, the intermediate portion of the body, such as U-shaped intermediate portion 1835, is configured or shaped to cause, when the mobile connector is connected to a mobile device in a first orientation, a portion of the back portion of the flash drive to be located behind the mobile device. The portion of the back portion that can be located behind the mobile device can be a majority of the back portion.

Mobile connector 1215 is a connector that is configured to connect to and communicated with a mobile device. Examples of mobile device connectors include an Apple Lightning connector, an Apple 30-pin connector, an Apple Thunderbolt connector, a mini USB connector, a mini USB A-type connector, a mini USB B-type connector, a micro USB connector, a micro USB A-type connector, a micro USB B-type connector, and a UC-E6 connector. Connector 1220 is a connector that is configured to connect to and communicate with a device. Examples of device connectors include a full size USB connector, a standard USB connector, a standard A-type USB connector, a B-type USB connector, a mini USB connector, a mini USB A-type connector, a mini USB B-type connector, a micro USB connector, a micro USB A-type connector, a micro USB B-type connector, a UC-E6 connector, an Apple Lightning connector, an Apple 30-pin connector, and an Apple Thunderbolt connector.

Figure 19:
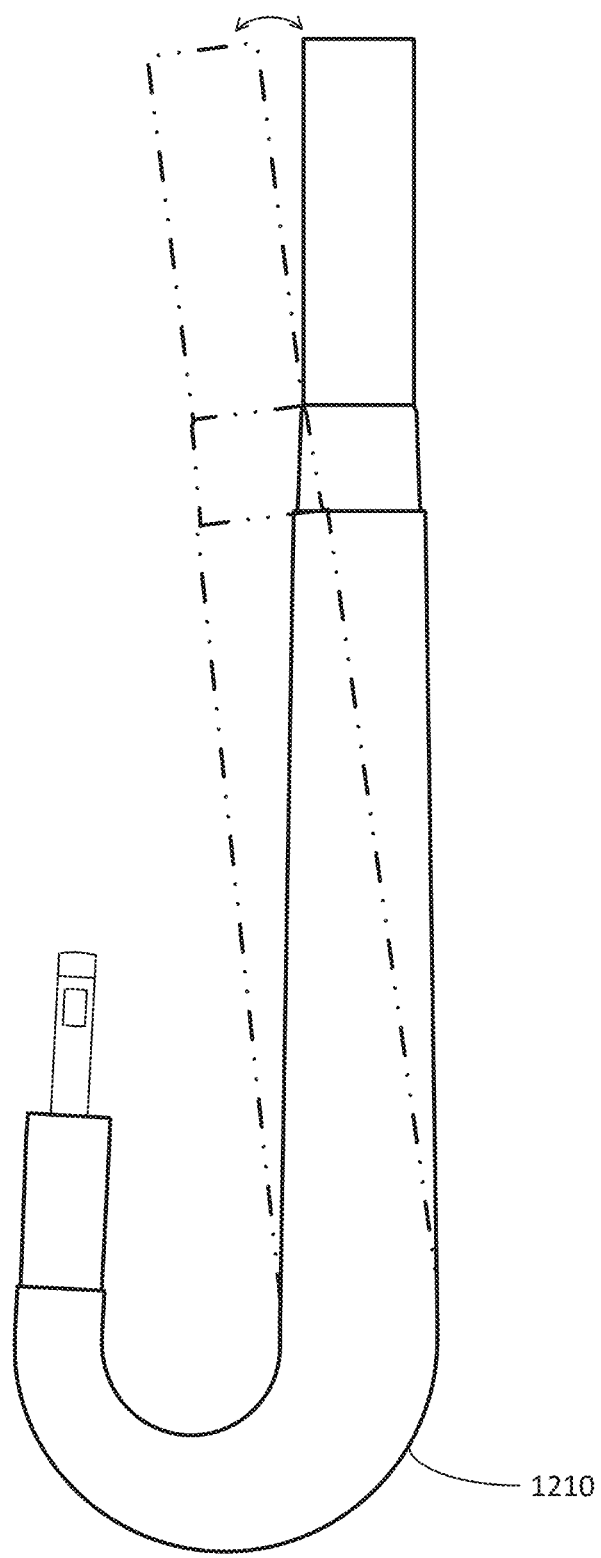
FIG. 19 is a diagram illustrating a flash drive that can bend to accommodate mobile devices of varying thicknesses, consistent with various embodiments.

FIG. 19 is a diagram illustrating a flash drive that can bend to accommodate mobile devices of varying thicknesses, consistent with various embodiments. Different mobile devices may have different thicknesses. For example, an Apple iPod Touch may be 6.1 mm thick, while an Apple 5C iPhone may be 8.9 mm thick. In some embodiments, in order to accommodate mobile devices of varying thicknesses, the intermediate portion of the flash drive can be configured to cause a specific separation distance between the front and back portions of the flash drive. This configuration creates a gap between the front and back portions of the flash drive sufficient to enable the flash drive to wrap around the thickest target mobile device when connected to the thickest target mobile device.

A distance between a front portion of a flash drive, such as front portion 1225, and a back portion of the flash drive, such as back portion 1230, can be defined at a number of locations. In some embodiments, an imaginary line or plane can be utilized to define a first distance. For example, in FIG. 12 the side-view shows a dashed line, line 1265, that is defined by a first point along a plane where front portion 1225 joins with U-shaped intermediate portion 1235, and a second point along a plane where back portion 1230 joins with U-shaped intermediate portion 1235. Line 1265 can also be part of a plane that can be defined by choosing a third point that lies on one of these two planes.

A first distance, such as first distance 1250, can be defined as the distance between two points. The first point is a point on an inside surface of the front portion of the flash drive, such as front portion 1225, that is also on the above discussed line or plane, such as line 1265. The second point is a point on an inside surface of the back portion of the flash drive, such as back portion 1230, that is also on this line or plane. The first distance can be the distance between the first point and the second point. For example, for flash drive 1210, the first distance is first distance 1250.

In some embodiments, the front portion transitions to the intermediate portion along one of the two above discussed planes, which can be substantially perpendicular to a line in the first direction. The back portion transitions to the intermediate portion, along the other one of the two above discussed planes, which can be substantially perpendicular to a line in the second direction. In some embodiments, the two above discussed planes are coplanar, and the two planes can be substantially perpendicular to the a line in the first direction and/or a line in the second direction.

In order to enable the flash drive to accommodate a variety of thicknesses of mobile devices, it was determined based on an analysis of a variety of mobile devices of varying thicknesses that a range of practical first distances is between approximately 3 mm and approximately 7 mm, with a preferred first distance of 5.5 mm. In some embodiments, the intermediate portion of the flash drive, such as U-shaped intermediate portion 1235, can be shaped or configured to cause a specific first distance, such as a first distance that is in the range of practical first distances. For example, U-shaped intermediate portion 1235 can be shaped or configured so that first distance 1250 is between 3 mm and 7 mm.

The inside surface of the back portion of the flash drive is the surface of the back portion of the flash drive that is closest to the mobile device, when the flash drive is connected to the mobile device as depicted in FIG. 14. The inside surface of the front portion of the flash drive is the surface of the front portion of the flash drive that is closest to the inside surface of the back surface of the flash drive.

A second distance, such as second distance 1255, can be defined at the distance between two points. A third point can be a point on a center line of the mobile connector, such as a point on center line 1260 of mobile connector 1215. The point can also or alternatively by a point on a plane that bisects the mobile connector, and that contains the center line. For example, the plane can be the plane that contains center line 1260, and that is perpendicular to the plane of the paper of FIG. 12. A fourth point can be the point on the inside surface of the back portion of the flash drive that is closest to the third point. The second distance can be the distance between the third point and the fourth point. For example, for flash drive 1210, the second distance is second distance 1255

In order to enable the flash drive to accommodate a variety of thicknesses of mobile devices, it was determined based on an analysis of a variety of mobile devices of varying thicknesses that a range of practical second distances is between approximately 3 mm and approximately 7 mm, with a preferred second distance of 5.5 mm. In some embodiments, the intermediate portion of the flash drive, such as U-shaped intermediate portion 1235, can be shaped or configured to cause a specific second distance, such as a second distance that is in the range of practical second distances. For example, U-shaped intermediate portion 1235 can be shaped or configured so that second distance 1255 is between 3 mm and 7 mm.

In some embodiments, a portion of the flash drive is made of flexible material to enable the front and back portions of the flash drive to be bent apart. For example, a portion of U-shaped intermediate portion 1235 can be made of a flexible material to enables U-shaped intermediate portion 1235 to be bent to increase or reduce the first distance and/or the second distance, as depicted in FIG. 19. As used herein, a portion of some object or material can be the entirety of the object or material. This enables a flash drive that can be bent to accommodate mobile devices of varying thicknesses. The back portion of some embodiments of the flash drive can fit snugly against the back of a mobile device when the flash drive is connected to the mobile device. The flash drive can also fit a thicker mobile device as well. By bending the flash drive to increase the first distance and/or the second distance, the flash drive can wrap around a thicker mobile device to utilize space behind the mobile device.

Analysis and experiments have determined that materials with a Shore A hardness durometer of between 70 and 95, such as some elastomeric polymers, have sufficient flexibility for use in the flash drive, and that 85 is a preferred Shore A hardness durometer. When the intermediate portion, such as U-shaped intermediate portion 1235, is made of a material with a Shore A durometer of between 70 and 95, the intermediate portion can flex and bend sufficiently to enable the flash drive to accommodate an adequate range of thicknesses of mobile devices. A material with a Shore A durometer of 85 was determined to be a good trade-off between having the flash drive bend easily enough to fit on mobile devices of a variety of thicknesses, and yet still be stiff enough to provide to give the user feedback (though the stiffness that the user can feels) that the flash drive should not be bent too far. Analysis of various materials have determined a number of materials, such as elastomeric polymers, that are adequate for use in the flexible portion of the flash drive. These materials include thermoplastic polyurethane (TPU), polypropylene, thermoplastic elastomer (TPE), and silicone, with TPU being the preferred material.

Figure 20:
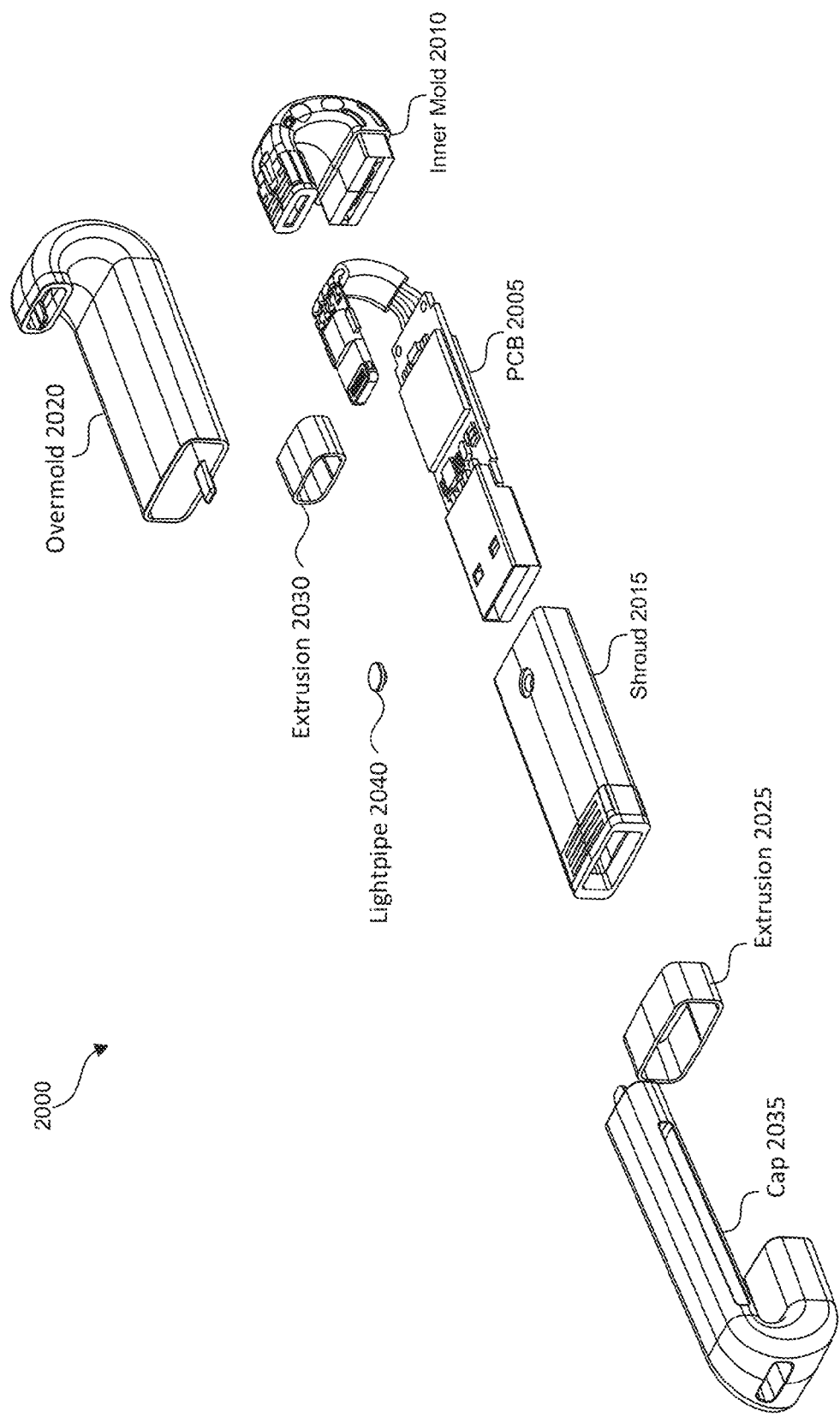
FIG. 20 is a diagram illustrating an exploded view of a flash drive, including a cap, that is shaped to utilize the space behind a mobile device, consistent with various embodiments.

FIG. 20 is a diagram illustrating an exploded view of a flash drive, including a cap, that is shaped to utilize the space behind a mobile device, consistent with various embodiments. In various embodiments, flash drive 2000 can be flash drive 110, or flash drive 1210, or can be different. Flash drive 2000 includes PCB 2005, inner mold 2010, shroud 2015, overmold 2020, extrusions 2025 and 2030, cap 2035, and lightpipe 2040. PCB 2005 includes a PCB, a flash memory IC, a controller, a USB connector, a Lightning connector, and wires that couple the Lightning connector to the PCB, among other components. The PCB and the wires couple the various components of PCB 2000. In various embodiments, PCB 2005 can include the components depicted in any of FIG. 2, FIG. 3, FIG. 4, FIG. 6, FIG. 7, or FIG. 8.

Inner mold 2010 is part of the intermediate portion of flash drive 2000. Inner mold 2010 is formed over a portion of PCB 2005. The portion of PCB 2005 over which inner mold 2010 is formed includes a portion of the Lightning connector, the wires between the Lightning connector and the PCB, and a portion of the PCB. In one embodiment, inner mold 2010 is formed over 2 mm of the end of the PCB. Inner mold 2010 can be made of material with a Shore A durometer of between 70 and 95. Inner mold 2010 can be made of any of TPU, polypropylene, TPE, or silicone, among others. To form inner mold 2010, a mold in the desired shape is created. The portion of PCB 2005 to be covered by inner mold 2010 is placed inside of the mold, and an overmold process, also referred to as an insertion molding process, is used. The overmold material is injected in the form, and is allowed to cure and harden to form inner mold 2010. Inner mold 2010 is preferably formed of TPU with a Shore A durometer of 85.

In order to help inner mold 2010 stay attached to the PCB of PCB 2005, in some embodiments, two holes are cut in the end of the PCB over which inner mold 2010 will be formed. When the TPU is injected into the mold, the TPU flows into the two holes. After curing, the hardened TPU that formed in these two holes enables inner mold 2010 to stay firmly attached to the PCB.

Lightpipe 2040 is formed of a material that conducts light. Lightpipe 2040 is inserted in shroud 2015, and shroud 2015 is slid over PCB 2005. Shroud 2015 can be made of acrylonitrile butadiene styrene (ABS), among other materials. Placing shroud 2015 over PCB 2005 serves several purposes. For example, an overmold is formed over PCB 2005 in a later manufacturing step, and shroud 2015 protects the PCB and its components from the overmold. Further, while inner mold 2010 is attached to PCB 2005, the connection may not have the mechanical strength needed to stay attached, given the stresses that are created when flash drive 2000 is bent to fit around a thick mobile device. Inner mold 2010 has a narrowed end. Shroud 2015 slides over PCB 2005, and also slides over the narrowed end of inner mold 2010.

With this configuration, when flash drive 2000 is bent, the portion of the shroud that encapsulates the narrow end of inner mold 2010 also helps to mechanically support inner mold 2010 when the forces that result from bending occur. Rather than inner mold 2010 potentially breaking off of the end of PCB 2005 due to the forces generated by the bend, some of these forces are transferred to shroud 2015, which transfers the forces further down PCB 2005. Once shroud 2015 is properly positioned over/around PCB 2005, lightpipe 2040 is positioned over an LED on the PCB. Positioned thusly, lightpipe 2040 can pass light from the LED to the outside of flash drive 2000, where the light can be seen by a user.

Overmold 2020 is formed over PCB 2005, inner mold 2010, and shroud 2015 (which is positioned over/around a portion of PCB 2005). Overmold 2020 can be made of ABS, TPU, polypropylene, TPE, or silicone, among others. To form overmold 2020, a mold in the desired shape is created. The portion of PCB 2005, inner mold 2010, and shroud 2015 to be covered by overmold 2020 is placed inside of the mold, and an overmold process is used to create overmold 2020. The overmold material is injected in the form, and is allowed to cure and harden to form overmold 2020. Overmold 2020 is preferably formed of ABS.

In some embodiments, extrusions 2025 and 2030 are metal extrusions, such as aluminum extrusions. When overmold 2020 is formed, it does not entirely encapsulate inner mold 2010 or shroud 2015. One end of overmold 2020 is formed pulled back a distance from an end of inner mold 2010. The other end of overmold 2020 is formed pulled back another distance from an end of shroud 2015. Extrusion 2030 slides over the end of inner mold 2010 that is nearest to the Lightning connector, where extrusion 2030 abuts against one end of overmold 2020. Extrusion 2025 slides over the end of shroud 2015 that is nearest to the USB connector, where extrusion 2025 abuts against a second end of overmold 2020. Glue is used to attach the two extrusions to flash drive 2000.

Cap 2035 is a J-shaped cap that can be placed over the two connectors to protect the connectors. Can 2035 can be made of ABS, TPU, polypropylene, TPE, or silicone, among other materials. Cap 2035 has a hole at each end that is shaped to accommodate the connector that is to be inserted in the hold. Cap 2035 has a hole at the middle of the curved portion of cap 2035. This hole can be used to, for example, attach cap 2035 to a key ring. When flash drive 2000 is inserted in cap 2035, cap 2035 snugly holds flash drive 2000.

Figure 21:
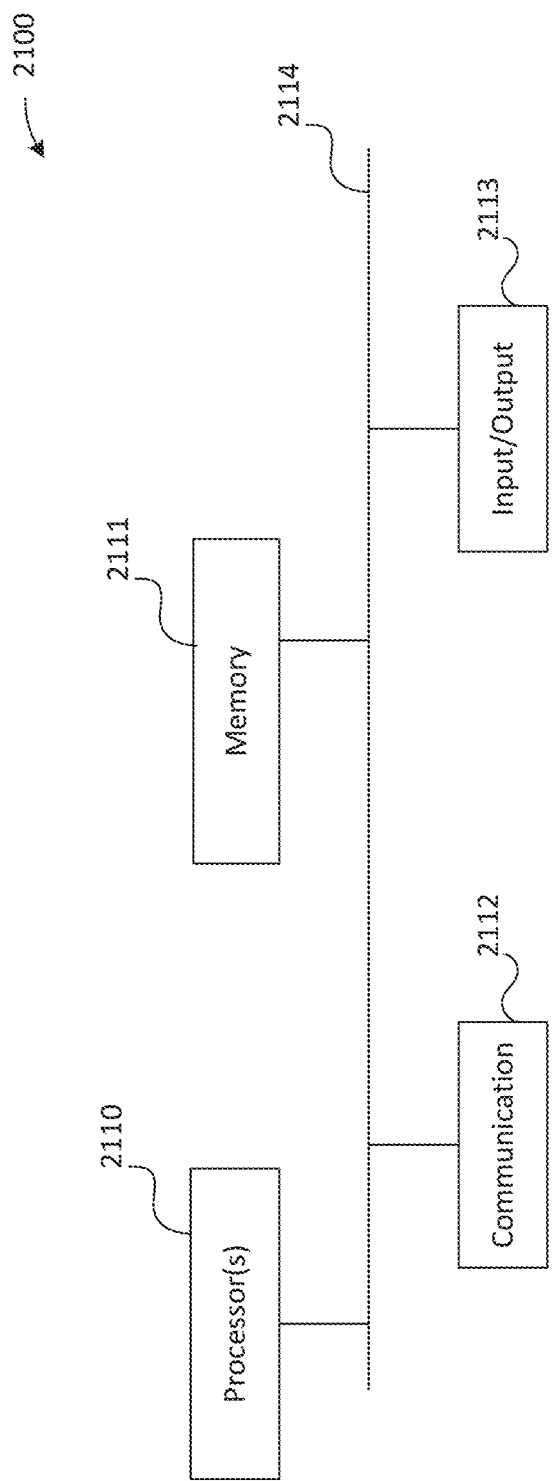
FIG. 21 is a block diagram illustrating an example of a processing system in which at least some operations described herein can be implemented, consistent with various embodiments.

FIG. 21 is a block diagram illustrating an example of a processing system in which at least some operations described herein can be implemented, consistent with various embodiments. Processing device 2100 can represent any of the computing devices described above, e.g., laptop 115, smartphone 120, non-iOS computing device 505, iOS computing device 510, source device 905, mobile device 910, or smart phone 1005. Any of these systems can include two or more processing devices, as is represented in FIG. 21, which can be coupled to each other via a network or multiple networks.

In the illustrated embodiment, the processing system 2100 includes one or more processors 2110, memory 2111, a communication device 2112, and one or more input/output (I/O) devices 2113, all coupled to each other through an interconnect 2114. The interconnect 2114 may be or include one or more conductive traces, buses, point-to-point connections, controllers, adapters and/or other conventional connection devices. The processor(s) 2110 may be or include, for example, one or more general-purpose programmable microprocessors, microcontrollers, application specific integrated circuits (ASICs), programmable gate arrays, or the like, or any combination of such devices. The processor(s) 2110 control the overall operation of the processing device 2100. Memory 2111 may be or include one or more physical storage devices, which may be in the form of random access memory (RAM), read-only memory (ROM) (which may be erasable and programmable), flash memory, miniature hard disk drive, or other suitable type of storage device, or any combination of such devices. Memory 2111 may store data and instructions that configure the processor(s) 2110 to execute operations in accordance with the techniques described above. The communication device 2112 may be or include, for example, an Ethernet adapter, cable modem, Wi-Fi adapter, cellular transceiver, Bluetooth transceiver, or the like, or any combination thereof. Depending on the specific nature and purpose of the processing device 2100, the I/O devices 2113 can include various devices, e.g., a display (which may be a touch screen display), audio speaker, keyboard, mouse or other pointing device, microphone, camera, etc.

Unless contrary to physical possibility, it is envisioned that (i) the methods/steps described above may be performed in any sequence and/or in any combination, and that (ii) the components of respective embodiments may be combined in any manner.

The techniques introduced above can be implemented by programmable circuitry programmed/configured by software and/or firmware, or entirely by special-purpose circuitry, or by any combination of such forms. Such special-purpose circuitry (if any) can be in the form of, for example, one or more application-specific integrated circuits (ASICs), programmable logic devices (PLDs), field-programmable gate arrays (FPGAs), etc.

Software or firmware to implement the techniques introduced here may be stored on a machine-readable storage medium and may be executed by one or more general-purpose or special-purpose programmable microprocessors. A "machine-readable medium", as the term is used herein, includes any mechanism that can store information in a form accessible by a machine (a machine may be, for example, a computer, network device, cellular phone, personal digital assistant (PDA), manufacturing tool, any device with one or more processors, etc.). For example, a machine-accessible medium includes recordable/non-recordable media (e.g., read-only memory (ROM); random access memory (RAM); magnetic disk storage media; optical storage media; flash memory devices; etc.), etc.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

The invention claimed is:
1. A flash drive that provides expanded digital storage for a handheld electronic device that enables the flash drive to utilize a space behind the handheld electronic device when the flash drive is connected to the handheld electronic device, the flash drive comprising;

a flash drive memory;
a connector plug that physically interfaces with the handheld electronic device thereby providing the external device access to the flash drive memory;
a housing, the housing substantially J-shaped having an elongated main body, and a hooked distal end, wherein the elongated main body contains the flash drive memory and when the connector plug is physically interfaced with the handheld electronic device the major axis of the elongated main body is positioned substantially parallel to a rear surface of the handheld electronic device, and the connector plug is positioned at the opposite tip of the hooked distal end; and
wiring configured to carry input, output, power, and ground signals and positioned from the elongated main body connected to the flash drive memory through the hooked distal end to the connector plug.

2. The flash drive of claim 1, wherein the connector plug is a first connector plug and further comprising:
a second connector plug that physically interfaces with a second external device thereby providing the second external device access to the flash drive memory, wherein the second connector plug is of a different type than the first connector plug, and the second connector plug is affixed to the elongated main body of the hook-shaped housing opposite of the hooked distal end.

3. The flash drive of claim 1, wherein the connector plug format is any one of:
Apple Lightning connector, an Apple 30-pin connector, an Apple Thunderbolt connector, a mini USB connector, a mini USB A-type connector, a mini USB B-type connector, a micro USB connector, a micro USB A-type connector, a micro USB B-type connector, or a UC-E6 connector, and wherein the second connector is one of a full size USB connector, a standard USB connector, a standard A-type USB connector, a B-type USB connector, a mini USB connector, a mini USB A-type connector, a mini USB B-type connector, a micro USB connector, a micro USB A-type connector, a micro USB B-type connector, or a UC-E6 connector.

4. The flash drive of claim 1, wherein the connector plug is oriented at an angle that causes a portion of the housing to press up against the handheld electronic device when the flash drive is connected to the handheld electronic device.

5. The flash drive of claim 1, wherein the hooked distal end is constructed of flexible material such that the elongated main body of the housing is enabled to adjust angle with respect to the hooked distal end to accommodate connection of the flash drive to external devices of different thicknesses.

6. The flash drive of claim 2, further comprising:
a J-shaped cap which slides over and covers two or more of the connector plugs, the J-shaped cap is removable from the flash drive.

7. The flash drive of claim 1, wherein the hooked distal end of the housing tapers approaching the connector plug.

8. The flash drive of claim 1, wherein the location on housing where there elongated main body and the hooked distal end meet is constructed as a single, uninterrupted external surface.

9. A flash drive that provides expanded digital storage for a handheld electronic device that enables the flash drive to utilize a space behind the handheld electronic device when the flash drive is connected to the handheld electronic device, the flash drive comprising;
flash memory;
a connector plug that physically interfaces with the handheld electronic device thereby providing the handheld electronic device access to the flash memory; and
a hook-shaped housing having an elongated main body and a hooked distal end, wherein the elongated main body contains the flash memory, and the connector plug is positioned at hooked distal end, where the connector plug is substantially parallel to the major axis of the elongated main body of the hook-shaped housing when connected to the handheld electronic device.

10. The flash drive of claim 9, wherein the hooked distal end is constructed of flexible material that encloses an electrical connection between the connector plug and the memory array.

11. The flash drive of claim 9, wherein the connector plug is a first connector plug and further comprising:
a second connector plug that physically interfaces with a second external device thereby providing the second external device access to the flash memory, wherein the second connector plug is of a different type than the first connector plug, and the second connector plug is affixed to the main body of the hook-shaped housing.

12. The flash drive of claim 9, wherein the connector plug format is any one of:
Apple Lightning connector, an Apple 30-pin connector, an Apple Thunderbolt connector, a mini USB connector, a mini USB A-type connector, a mini USB B-type connector, a micro USB connector, a micro USB A-type connector, a micro USB B-type connector, or a UC-E6 connector, and wherein the second connector is one of a full size USB connector, a standard USB connector, a standard A-type USB connector, a B-type USB connector, a mini USB connector, a mini USB A-type connector, a mini USB B-type connector, a micro USB connector, a micro USB A-type connector, a micro USB B-type connector, or a UC-E6 connector.

13. The flash drive of claim 9, wherein the substantially parallel orientation of the connector plug is imperfect such that the elongated main body of the housing presses up against the handheld electronic device when the flash drive is connected to the handheld electronic device.

14. The flash drive of claim 13, wherein the hooked distal end is constructed of flexible material such that the elongated main body of the housing is enabled to adjust angle with respect to the hooked distal end to accommodate connection of the flash drive to external devices of different thicknesses.

15. The flash drive of claim 9, wherein the hooked distal end forms a smooth curved shape.

16. The flash drive of claim 11, further comprising:
a hook-shaped cap which slides over and covers two or more of the connector plugs, the hook-shaped cap is removable from the flash drive.

17. The flash drive of claim 10, wherein the flexible material of the hooked distal end orients the connector plug at an angle towards the main body when the flash drive is disconnected from the handheld electronic device.

18. A hooked-shape flash drive with linear and hooked body sections wherein the hooked body section includes a hook, comprising;
a flash memory contained within the linear body section;
a first connector plug positioned at a distal end of the linear body section electrically connected to the flash memory; and
a second connector plug positioned at a distal end of the hook in the hooked body section is electrically connected to the flash memory array, wherein the second connector plug interfaces with a different type of outlet than the first connector plug.

19. The flash drive of claim 18, further comprising:
a hook-shaped cap which slides over and covers the first and second connector plugs, the hook-shaped cap is removable from the flash drive.

20. A flash drive that provides expanded digital storage for a handheld electronic device that enables the flash drive to utilize a space behind the handheld electronic device when the flash drive is connected to the handheld electronic device, the flash drive comprising;
a flash drive memory array which includes an input/output connection extending from a particular edge of the flash drive memory array;
a connector plug that physically interfaces with the handheld electronic device and electrically extending from the input/output connection of the flash drive memory array thereby providing the external device access to the flash drive memory array, wherein the connector plug is oriented at least 180 degrees from the particular edge of the flash memory array from which the input/output connection extends; and
a casing, the casing providing an external covering to the flash drive memory array and the input/output connection, wherein the casing is a single, uninterrupted structure.

21. The flash drive of claim 20, wherein the extension of the input/output connection is constructed of flexible material.

22. The flash drive of claim 20, wherein the connector plug is a first connector plug and further comprising:
a second connector plug that physically interfaces with a second external device thereby providing the second external device access to the flash drive memory array, wherein the second connector plug is of a different type than the first connector plug, and the second connector plug extends from the edge opposite the particular edge.

23. The flash drive of claim 20, wherein the connector plug format is any one of:
Apple Lightning connector, an Apple 30-pin connector, an Apple Thunderbolt connector, a mini USB connector, a mini USB A-type connector, a mini USB B-type connector, a micro USB connector, a micro USB A-type connector, a micro USB B-type connector, or a UC-E6 connector, and wherein the second connector is one of a full size USB connector, a standard USB connector, a standard A-type USB connector, a B-type USB connector, a mini USB connector, a mini USB A-type connector, a mini USB B-type connector, a micro USB connector, a micro USB A-type connector, a micro USB B-type connector, or a UC-E6 connector.

24. The flash drive of claim 20, wherein the connector plug orientation is greater than 180 degrees such that the main body of the housing presses up against the handheld electronic device when the flash drive is connected to the handheld electronic device.

25. The flash drive of claim 24, wherein the extension of the input/output connection is constructed of flexible material such that the flash drive memory array is enabled to adjust angle with respect to the connector plug to accommodate connection of the flash drive to the handheld electronic device.

26. The flash drive of claim 20, wherein the at least 180 degree orientation of the connector plug with respect to the flash drive memory array is formed by a casing in a smooth curved shape.

* * * * *